(12) United States Patent
Kulkarni et al.

(10) Patent No.: US 12,292,459 B2
(45) Date of Patent: May 6, 2025

(54) CURRENT SENSORS EMPLOYING ROGOWSKI COILS AND METHODS OF USING SAME

(71) Applicant: Georgia Tech Research Corporation, Atlanta, GA (US)

(72) Inventors: Shreyas Bhalchandra Kulkarni, Atlanta, GA (US); Deepakraj M Divan, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 418 days.

(21) Appl. No.: 17/597,902

(22) PCT Filed: Jul. 29, 2020

(86) PCT No.: PCT/US2020/044007
§ 371 (c)(1),
(2) Date: Jan. 28, 2022

(87) PCT Pub. No.: WO2021/021889
PCT Pub. Date: Feb. 4, 2021

(65) Prior Publication Data
US 2022/0252642 A1 Aug. 11, 2022

Related U.S. Application Data

(60) Provisional application No. 62/879,700, filed on Jul. 29, 2019.

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC .. G01R 19/0092; G01R 15/18; G01R 15/181; G01R 15/182; G01R 15/183;
(Continued)

(56) References Cited

U.S. PATENT DOCUMENTS 5,434,509 A 7/1995 Blades
6,094,044 A * 7/2000 Kustera ............... G01R 15/181
324/127

(Continued)

FOREIGN PATENT DOCUMENTS

CN 102967742 A 3/2013

OTHER PUBLICATIONS

Search Report from EP Application No. 20846878.5 dated Jul. 19, 2023.
(Continued)

*Primary Examiner* — Thang X Le
(74) *Attorney, Agent, or Firm* — Troutman Pepper Hamilton Sanders LLP; Ryan A. Schneider; Korbin M. Blunck

(57) ABSTRACT

An exemplary embodiment provides a current sensor comprising a printed circuit board (PCB), a Rogowski coil, and a controller. The PCB can comprise an aperture configured to receive a conductor carrying an alternating electrical current. The Rogowski coil can be positioned on the PCB along a perimeter of the aperture. The controller can be in electrical communication with the Rogowski coil and configured to generate an output signal indicative of the alternating electric current carried by the conductor. The current sensor can be configured to measure the alternating electric current relative to a full scale at a resolution of 1000:1 and at an accuracy within 1%, wherein the full scale can range over 5000:1.

25 Claims, 33 Drawing Sheets

(58) Field of Classification Search
CPC .. G01R 15/184; G01R 15/185; G01R 15/186; H01F 5/003; H01F 38/32
See application file for complete search history.

(56) References Cited

U.S. PATENT DOCUMENTS

| | | | | |
|---|---|---|---|---|
| 8,264,215 | B1* | 9/2012 | Kovach | H02G 13/60 |
| | | | | 324/555 |
| 8,981,800 | B2* | 3/2015 | Tzivanopoulos | G01R 15/20 |
| | | | | 324/252 |
| 9,081,040 | B2* | 7/2015 | Chamarti | G01R 1/20 |
| 2008/0048643 | A1* | 2/2008 | Delevoye | G01R 15/185 |
| | | | | 324/117 R |
| 2009/0284248 | A1* | 11/2009 | Etter | G01R 15/181 |
| | | | | 324/126 |
| 2015/0331020 | A1 | 11/2015 | Gilbert | |
| 2015/0362532 | A1* | 12/2015 | Chartouni | H01F 38/32 |
| | | | | 324/126 |
| 2017/0315166 | A1 | 11/2017 | Yuet et al. | |
| 2017/0356935 | A1 | 12/2017 | Hurwitz | |
| 2019/0302151 | A1* | 10/2019 | Manikandan | H02H 1/0007 |

OTHER PUBLICATIONS

International Search Report and Written Opinion For International Application No. PCT/US2020/044007 dated Oct. 16, 2020.

Kulkarni et al: "An Edge-Intelligent, Clip-on Rogowski Current Sensor with Wide Dynamic Range", IEEE Sensors Journal, Nov. 19, 2019 (Nov. 19, 2019).

Ripka, Pavel: "Current sensors using magnetic materials", Journal of Optoelectronics and Advanced Materials, vol. 6, No. 2, Jun. 2004 (Jun. 1, 2004), pp. 587-592, XP055791199.

Office Action from Canadian Application No. 3,146,140 dated Feb. 15, 2024.

* cited by examiner

Figure 4
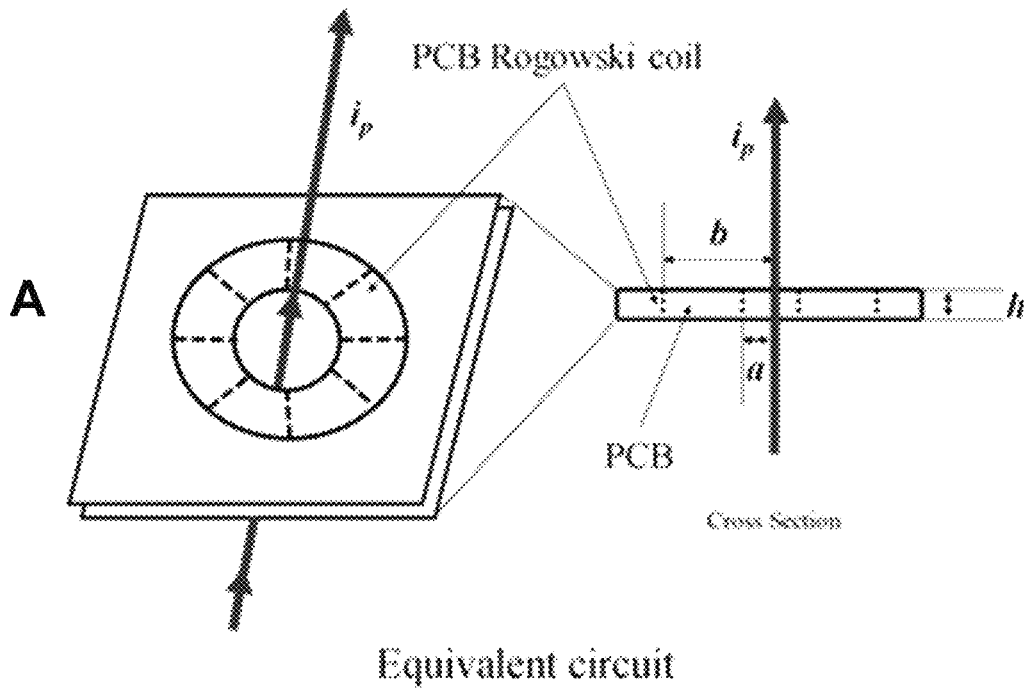
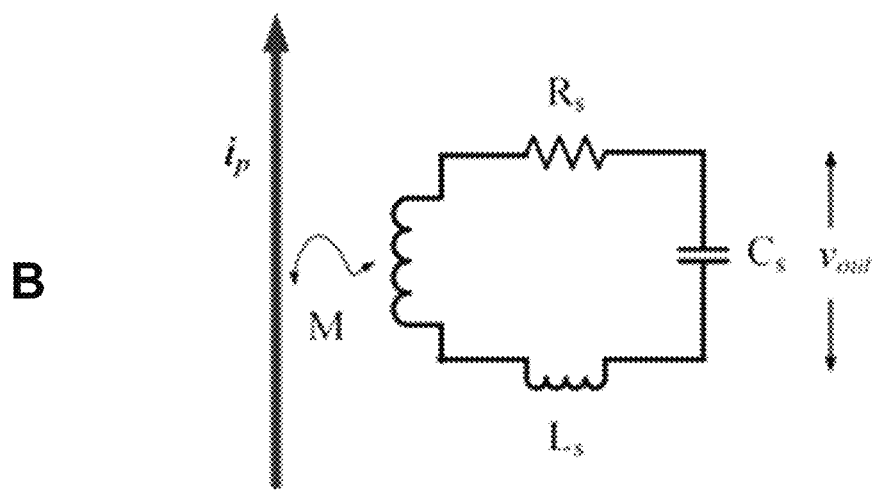

Figure 5
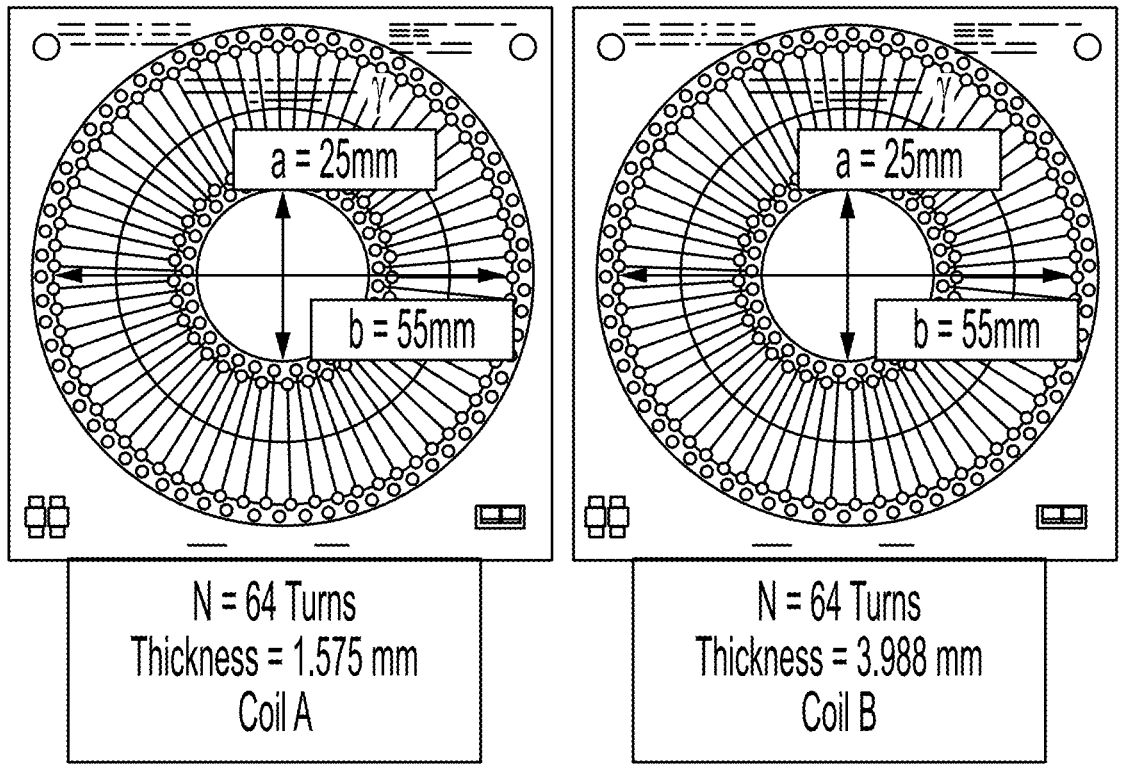
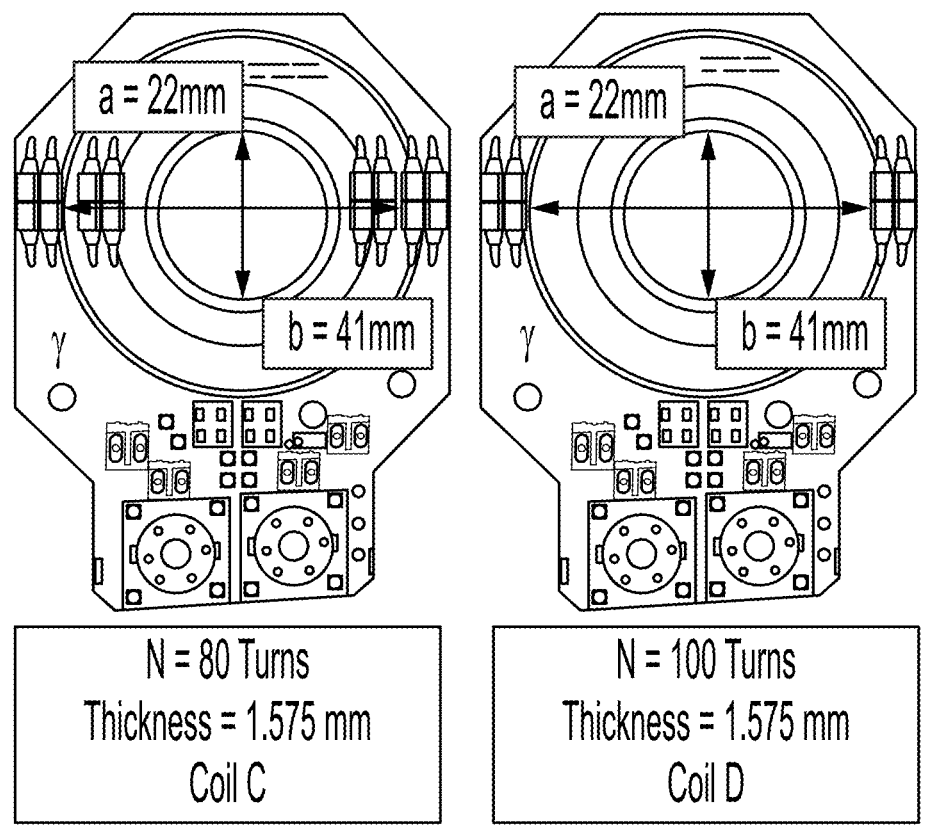

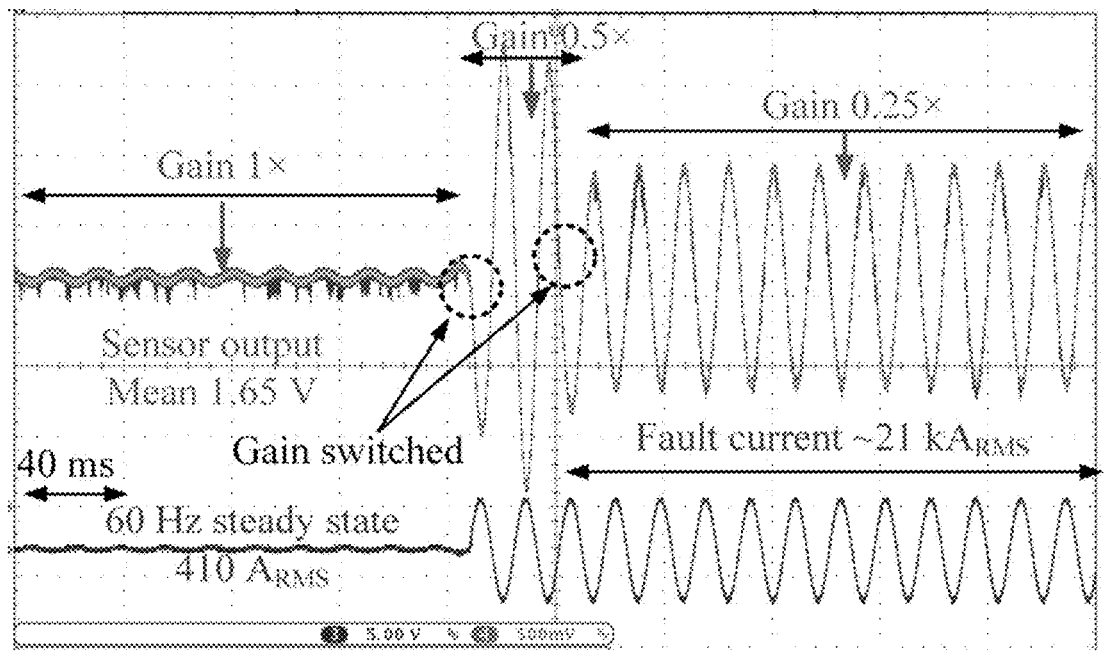
Figure 21A   O'scope waveforms
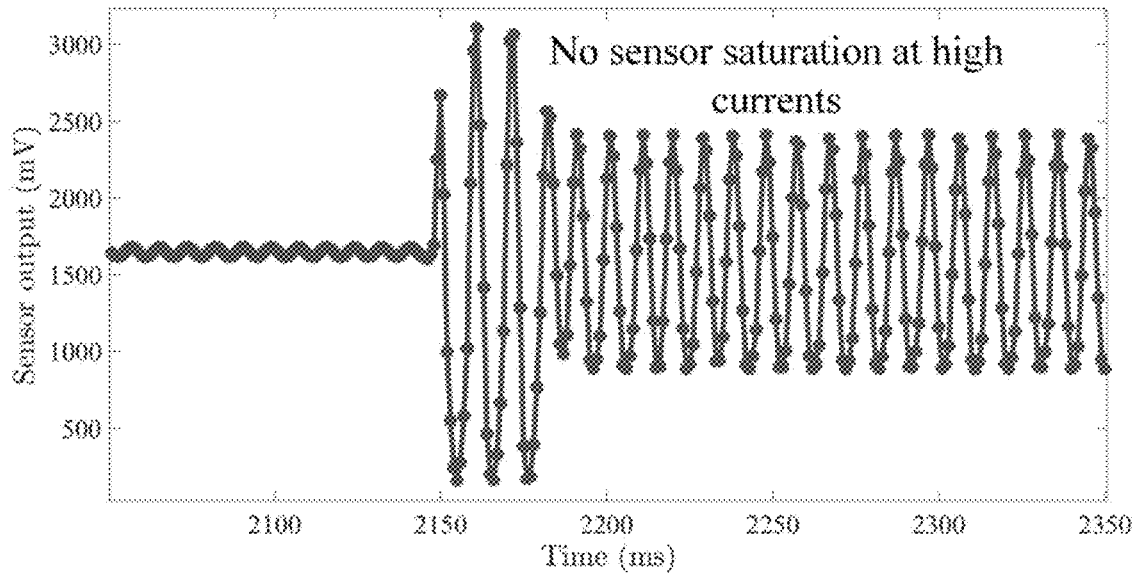
Figure 21B   ADC sampled data on the sensor

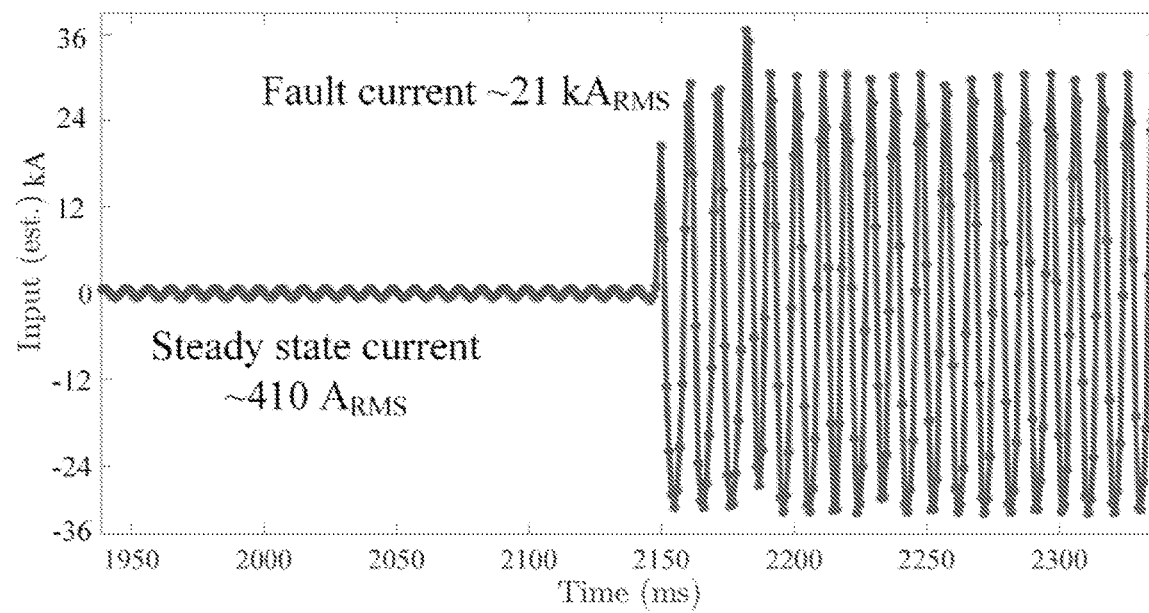
Figure 21C  Reconstructed current waveform
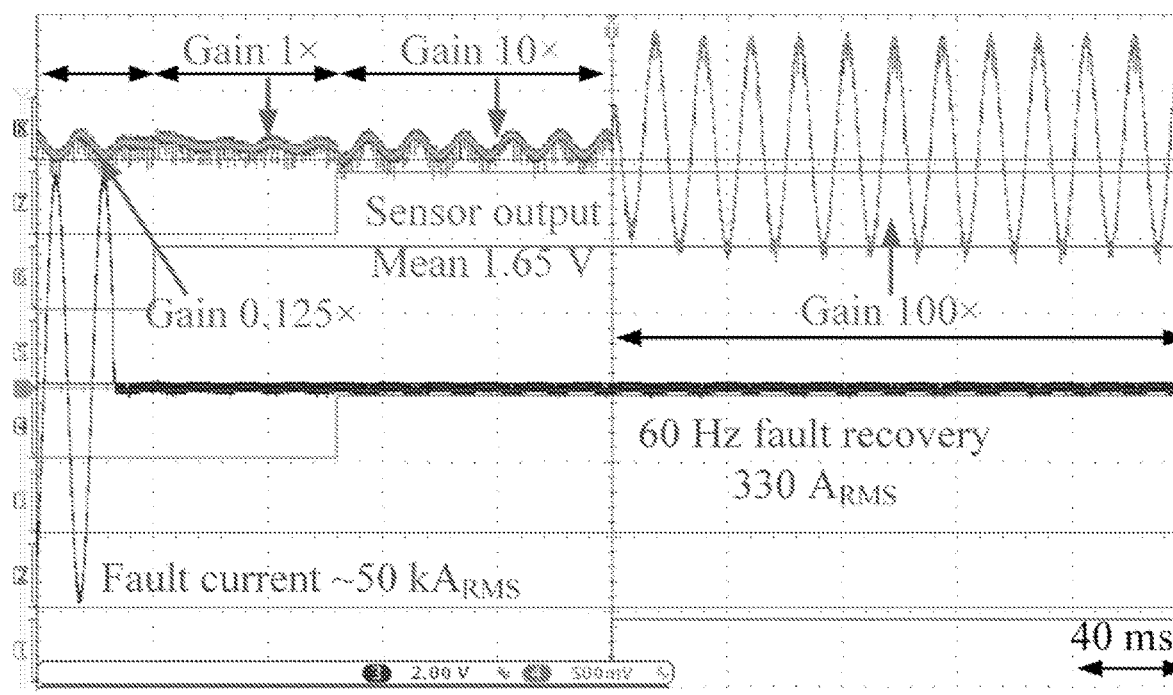
Figure 22A  O'scope waveforms

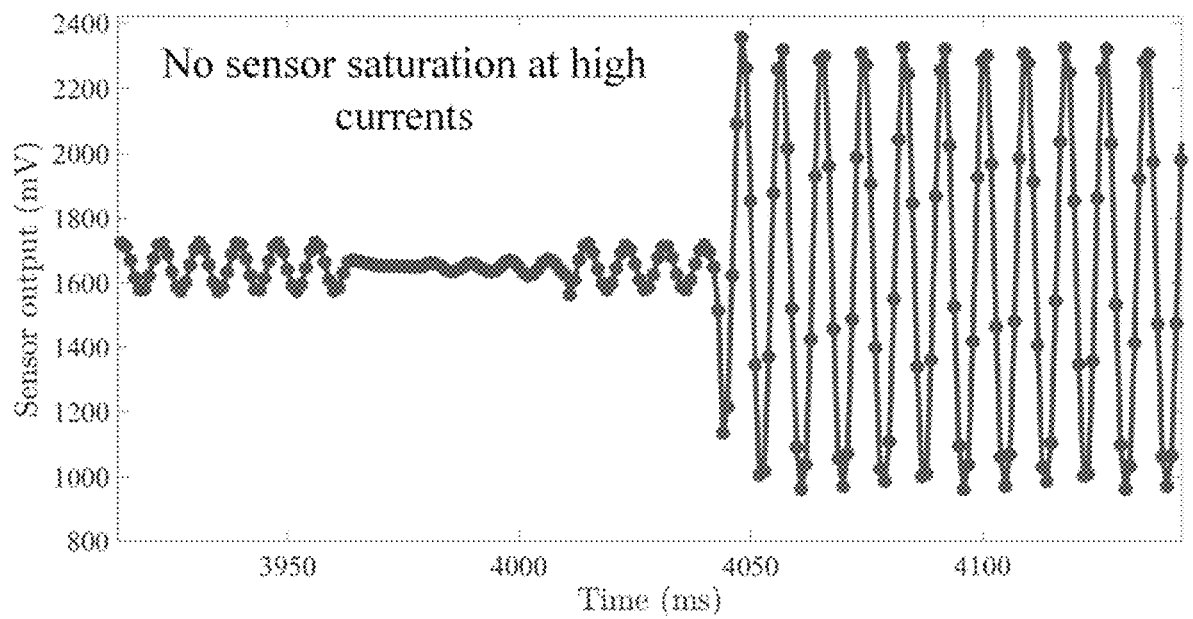
Figure 22B  ADC sampled data on the sensor
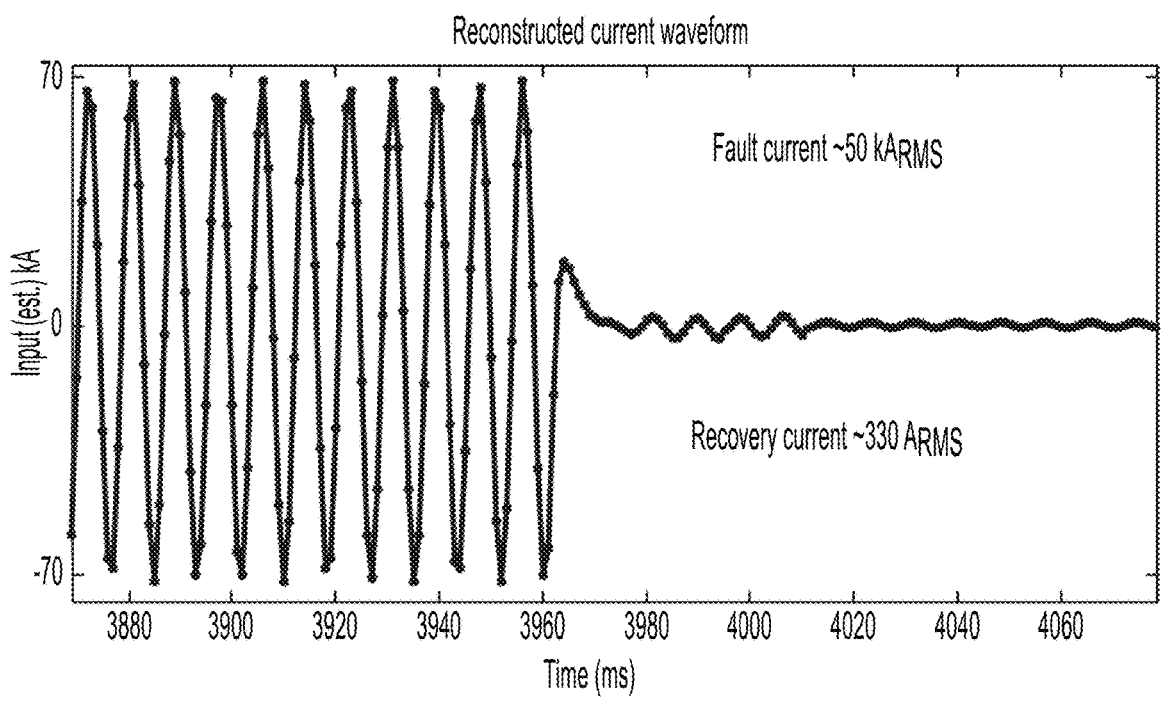
Figure 22C

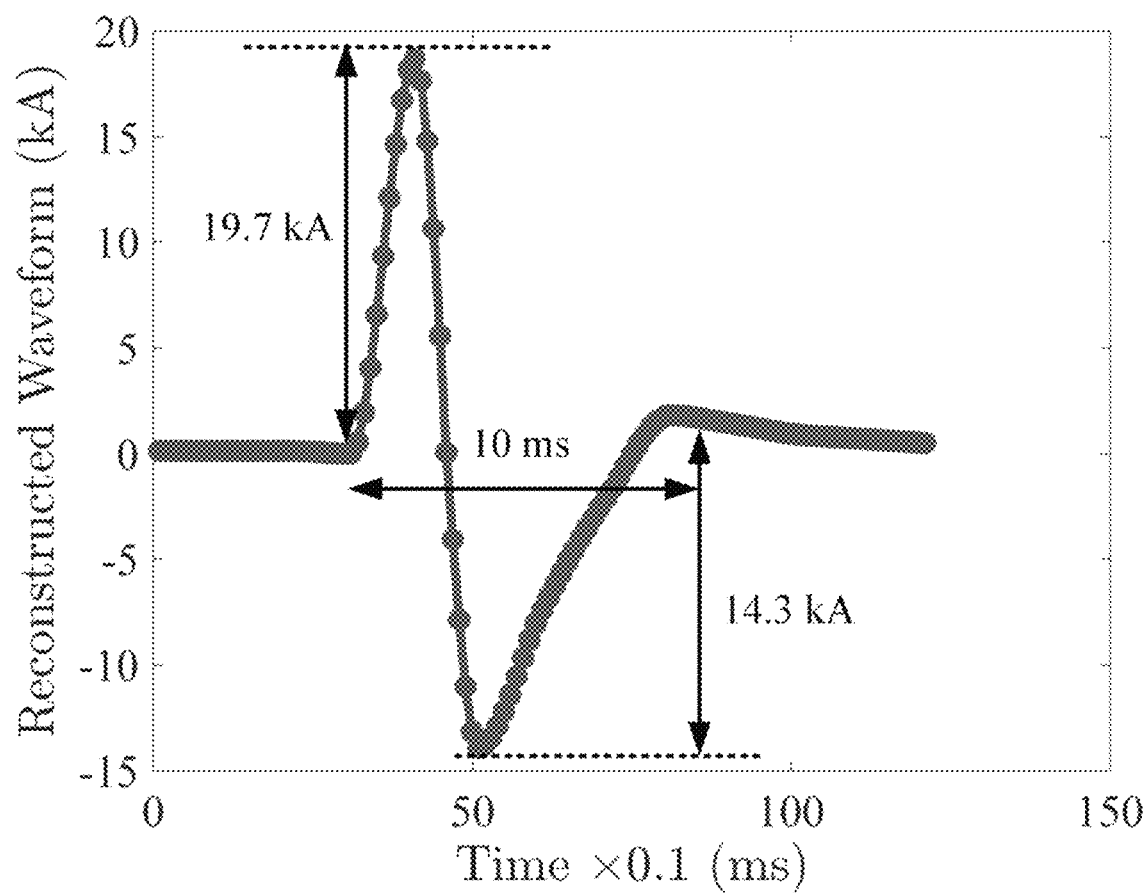
Figure 24B   Reconstructed current waveform

CURRENT SENSORS EMPLOYING ROGOWSKI COILS AND METHODS OF USING SAME

CROSS-REFERENCE TO RELATED APPLICATIONS

This application claims the benefit of U.S. Provisional Application Ser. No. 62/879,700, filed on 29 Jul. 2019, which is incorporated herein by reference in its entirety as if fully set forth below.

FEDERALLY SPONSORED RESEARCH STATEMENT

This invention was made with government support under Award No. DE-OE0000877, awarded by the Department of Energy. The government has certain rights in the invention.

TECHNICAL FIELD OF THE INVENTION

The various embodiments of the present disclosure relate generally to current sensors. More particularly, the various embodiments of the present disclosure are directed to current sensors employing Rogowski coils.

BACKGROUND OF THE INVENTION

Electric utilities are installing various sensors for advanced situational awareness into the sub-transmission and distribution networks. Current sensors are critical for recording steady state and fault currents in different parts of the grid. Current transformers have typically been used by utilities. Limitations of cost and dynamic range, however, are causing utilities to adopt newer solutions like Rogowski coils. The typical implementation of a Rogowski coil is shown in FIG. 1. Rogowski coils exhibit several advantages over current transformers (CTs) and other magnetic effect sensors like Hall effect or even shunt-based current transducers. Rogowski coils, which encircle the conductors, are typically air-cored, and hence do not saturate due to the absence of magnetic elements. A high bandwidth can be achieved, along with a linear response over a wide dynamic range, compared to CTs with magnetic cores. Rogowski coils are also resilient to thermal, conducted, and radiated noise. Additionally, they offer isolation and need minimal signal conditioning, making them ideal for power electronics applications. Compared to Rogowski coils, CTs can be bulky and expensive.

Utilities have used various sensors for capturing waveform signatures which are a useful resource for utility operations, particularly in protective relaying. These fault current signatures can also help in identifying faulty equipment, perform predictive maintenance, or post-event analysis. For instance, it has been shown that the waveform data can be used to recognize fault types in overhead distribution lines. Additionally, Rogowski coils have been used for stator fault diagnosis in machines.

With recent advances in manufacturing techniques, designers have integrated the toroidal windings on printed circuit boards (PCBs), thus achieving a compact form-factor, low cost and good reproducibility. The availability of precision-trimmed operational amplifiers (op-amps) has helped in achieving low drift, fast settling analog (active) integrator circuits. The Rogowski coil outputs a signal proportional to the differential of the current enclosed in it (di/dt sensor). Analog integrators can condition the signals from the Rogowski coil and feed them into a data converter and microprocessor-based unit that can record the data or perform certain control actions based on it. PCB-based Rogowski coils have been developed for both power-line frequencies (50/60 Hz) as well as switched mode power converters.

However, there are certain limitations on these conventional devices that need to be improved. For example, the dynamic range of Rogowski coils is limited by the signal conditioning circuitry. This is because the associated op-amps saturate at finite signal levels, causing signal distortion and clipping. These circuits can also add some phase shift in the signal, which can add to significant errors when the signal is used for power metering or for operating protection equipment.

With micro-processor and digital signal processor (DSP) based systems, the integration function can be performed digitally, using filters to achieve better phase response. An FPGA based digital integrator and a programmable gain amplifier (PGA) has been used to control the gain and ensure that the coil voltage is scaled for the ADC (analog to digital data converter) stage. Both time-domain and frequency-domain digital compensation techniques have been proposed for reconstructing the input current signals. These approaches, however, add costs in hardware, computation, and power consumption.

Additionally, with a traditional closed-coil structure, it is difficult to install these sensors on conductors already present in the field. Rather, utilities must de-energize the circuits, sever the conductors, and pass them through the Rogowski coil as part of the installation process—a task that significantly adds to the overall costs. Thus, retrofit capability is important for a low cost, commercially viable design. But while several designs have been proposed, the solutions are still significantly expensive (>$150) with no other advantages.

Several PCB-integrated Rogowski coil sensors have been proposed in literature, with precise tuning for frequencies of interest. The bandwidth of the Rogowski coil is determined by self-resonant frequency ($f_r$), which depends on the lumped parameters (L, C, R) of the coil. Thus, an understanding of the dependence of the parasitics on the coil construction is important. At lower frequencies, the coil can act as a self-integrating coil if the terminating resistance $R_t<\omega L$, and a di/dt sensor if $R_t>\omega L$; thus, coil termination is also important.

The integrator design at lower frequencies also can be challenging because a low frequency offset-drift can accumulate; or the capacitor in the RC feedback can discharge causing errors. It is difficult to design a wide bandwidth integrator that can measure both power line (50/60 Hz) as well as high frequencies (several kHz range) like those encountered in switching power converters. Often times, conventional PCB Rogowski coil implementations meet either power line or high frequency requirements. The combination of the frequency response of the PCB coil itself along with the $1^{st}$ order analog integrator are shown in FIG. 2. The +20 dB/dec due to the coil and 20 dB/dec from the integrator result in a relatively flat gain response over the integration bandwidth. Careful tuning of the integrator can result in a wide bandwidth design, which is limited only by the integration gain and the coil self-resonant frequency, as discussed below.

As such, an ideal signal conditioning circuit may entail a precise analog design with wide bandwidth, near-zero phase shift over frequencies ranging from power-line to several 10's of kHz, and can scale and track the signal according to the current being measured. This would make it possible to capture fast transients and fault currents without the limitations imposed by the signal conditioning circuitry.

An important limitation of the Rogowski signal conditioning system is the dynamic range. Even though Rogowski coils (air-cored) themselves do not saturate and offer higher dynamic range than the magnetic core based CTs (that can saturate), the primary limitation in conventional Rogowski coil-based sensors is the signal conditioning circuit. Active integrator-based signal conditioning can have a limited dynamic range and starts saturating (causing signal distortion and clipping) when the signal levels start hitting supply rail voltages. With a static integrator gain, the dynamic range is dictated by the rail voltages. This results in a significant level of selection and tuning in the field for matching the currents flowing to the sensor itself. As a consequence, utilities are forced to employ different sensors depending on the current rating of the asset, e.g., from 10-5,000 A for steady state in five distinct steps, not including fault currents.

As shown in FIG. 1, most conventional asset monitoring solutions based on Rogowski coils have a coil, an analog front end, an ADC, an MCU (micro-controller unit) and a radio. Some applications involve specialized sensors like μ-PMUs (micro-phasor measurement units) for advanced visibility into the grid or extracting d, q, and zero sequence currents in 3-phase systems. The radio includes a cellular network or a standard Internet of Things (IoT) protocol, with a wireless gate-way device for cloud connectivity. Today's sensors tend to be very expensive, with a typical current/ voltage sensor costing over $1200 to monitor a transformer asset that is of similar value, making cost justification very challenging. These costs do not include the back-end system for data management that needs to be customized, installed, and maintained. As a result, even though the need for ubiquitous sensing is well recognized, the high cost has limited the deployment of such sensors only to high value applications.

Therefore, there is a desire for improved current sensors that address the one or more of the issues discuss above. Various embodiments of the present disclosure address this desire.

BRIEF SUMMARY OF THE INVENTION

The present disclosure relates to current sensors and methods of measuring current. An exemplary embodiment provides a current sensor comprising a printed circuit board (PCB), a Rogowski coil, and a controller. The PCB can comprise an aperture configured to receive a conductor carrying an alternating electrical current. The Rogowski coil can be positioned on the PCB along a perimeter of the aperture. The controller can be in electrical communication with the Rogowski coil and configured to generate an output signal indicative of the alternating electric current carried by the conductor. The current sensor can be configured to measure the alternating electric current relative to a full scale at a resolution of 1000:1 and at an accuracy within 1%, wherein the full scale can range over 5000:1.

In any of the embodiments disclosed herein, the controller can be further configured to receive a signal from the Rogowski coil and amplify the signal by a predetermined variable gain.

In any of the embodiments disclosed herein, the controller can be configured to reduce the predetermined variable gain if both a magnitude of the signal from the Rogowski coil exceeds a first predetermined value and a rate of change of the magnitude of the signal from the Rogowski coil exceeds a second predetermined value.

In any of the embodiments disclosed herein, the controller can be configured to increase the predetermined variable gain if both a magnitude of the signal from the Rogowski coil falls below a third predetermined value and a rate of change of the magnitude of the signal from the Rogowski coil falls below a fourth predetermined value.

In any of the embodiments disclosed herein, the controller can be configured to generate the output signal indicative of the alternating electric current carried by the conductor at a sampling rate.

In any of the embodiments disclosed herein, the controller can be configured to increase the sampling rate if both a magnitude of a signal from the Rogowski coil exceeds a first predetermined value and a rate of change of the magnitude of the signal from the Rogowski coil exceeds a second predetermined value.

In any of the embodiments disclosed herein, the controller can be configured to decrease the sampling rate if both a magnitude of a signal from the Rogowski coil falls below a first predetermined value and a rate of change of the magnitude of the signal from the Rogowski coil falls below a second predetermined value.

In any of the embodiments disclosed herein, the controller can be configured to generate the output signal indicative of the alternating electric current carried by the conductor in response to a command signal received from a remote device.

In any of the embodiments disclosed herein, the controller can comprise a front-end amplifier, a low noise integrator, an adaptive programmable gain amplifier, an analog-to-digital converter, and a microcontroller.

In any of the embodiments disclosed herein, the PCB can comprise a first portion and a second portion. The first portion of the PCB can comprise a first portion of the aperture. The second portion of the PCB can comprise a second portion of the aperture. The first portion of the PCB can be detachably connected to the second portion of the PCB.

In any of the embodiments disclosed herein, the sensor can further comprise a power supply configured to provide electrical power to the current sensor.

In any of the embodiments disclosed herein, the power supply can comprise a solar panel.

In any of the embodiments disclosed herein, the sensor can further comprise a transceiver configured to transmit a signal to a remote device. The signal can be indicative of the electric current carried by the conductor.

In any of the embodiments disclosed herein, the transceiver can be a wireless transceiver.

Another embodiment provides a current sensor comprising a substrate, a Rogowski coil, an analog circuit, and analog-to-digital converter (ADC), and a microprocessor. The substrate can comprise an aperture configured to receive a conductor carrying an alternating current to be measured. The Rogowski coil can be positioned along a perimeter of the aperture and configured to generate an analog signal proportional to a magnitude of the current carried by the conductor. The analog circuit can be configured to receive the analog signal from the Rogowski coil and apply a variable gain to the analog signal to generate a gain-amplified analog output. The ADC can be configured to receive the gain-amplified analog output and generate a digital signal. The microprocessor can be configured to receive the digital signal and generate an output indicative of the magnitude of the current carried by the conductor. The microprocessor can be further configured to decrease the variable gain applied to the analog voltage output if both the magnitude of the analog signal exceeds a first value and a rate of change of the magnitude of the analog signal exceeds a second value. The microprocessor can be further configured to increase the variable gain applied to the analog output if both the magnitude of the analog signal falls below a third value and the rate of change of the magnitude of the analog signal falls below a fourth value.

In any of the embodiments disclosed herein, the substrate can comprise a first portion and a second portion. The first portion of the substrate can comprise a first portion of the aperture, and the second portion of the substrate can comprise a second portion of the aperture. The first portion of the substrate can be detachably connected to the second portion of the substrate.

In any of the embodiments disclosed herein, the current sensor can be configured to measure the alternating current relative to a full scale at a resolution of 1000:1 and at an accuracy within 10%, wherein the full scale can range over 5000:1.

Another embodiment provides a method of measuring alternating current carried by a conductor. The method can comprise positioning a current sensor about the conductor. The current sensor can comprise a substrate having an aperture and a Rogowski coil extending along a perimeter of the aperture, such that the conductor passes through the aperture. The method can further comprise: generating an analog signal at an output of the Rogowski coil, the analog signal proportional to a magnitude of the alternating current carried by the conductor; amplifying the analog signal by applying a variable gain to the analog signal to create a gain-amplified analog output; converting the gain-amplified analog output to a gain-amplified digital output; generating, based on the gain-amplified digital output, an output indicative of the magnitude of the current carried by the conductor; decreasing the variable gain if both the magnitude of the analog signal exceeds a first value and a rate of change of the magnitude of the analog signal exceeds a second value; and increasing the variable gain if both the magnitude of the analog signal falls below a third value and the rate of change of the magnitude of the analog signal falls below a fourth value.

In any of the embodiments disclosed herein, the method can further comprise transmitting the output indicative of the magnitude of the current carried by the conductor to a remote device.

In any of the embodiments disclosed herein, the output indicative of the magnitude of the current carried by the conductor can be transmitted via a wireless signal.

In any of the embodiments disclosed herein, the method can further comprise receiving a command from the remote device, wherein the transmitting is performed subsequent to the receiving the command.

In any of the embodiments disclosed herein, the current sensor can be configured to measure the alternating current relative to a full scale at a resolution of 1000:1 and at an accuracy within 10%, wherein the full scale can range over 5000:1.

These and other aspects of the present disclosure are described in the Detailed Description of the Invention below and the accompanying figures. Other aspects and features of embodiments of the present disclosure will become apparent to those of ordinary skill in the art upon reviewing the following description of specific, exemplary embodiments of the present disclosure in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the disclosure discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

FIGS. 4A and 4B illustrates the structure of a current sensor and equivalent circuit, respectfully, in accordance with an exemplary embodiment of the present disclosure.

FIG. 5 provides a photograph of four current sensors, in accordance with exemplary embodiments of the present disclosure.

FIGS. 21A-C provide plots of an oscilloscope waveform, ADC sampled data on the sensor, and a reconstructed waveform, respectively, for a fault current capture from 410 $A_{RMS}$ steady state to 21 $kA_{RMS}$ provides, in accordance with exemplary embodiments of the present disclosure.

FIGS. 22A-C provide plots of an oscilloscope waveform, ADC sampled data on the sensor, and a reconstructed waveform, respectively, for a fault recovery from 50 $kA_{RMS}$ to 330 $A_{RMS}$ provides, in accordance with exemplary embodiments of the present disclosure.

FIGS. 24A-B provide the oscilloscope waveform and reconstructed current waveform, respectively, during a pulse test of a current sensor, in accordance with exemplary embodiments of the present disclosure.

DETAILED DESCRIPTION OF THE INVENTION

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

Figure 1:
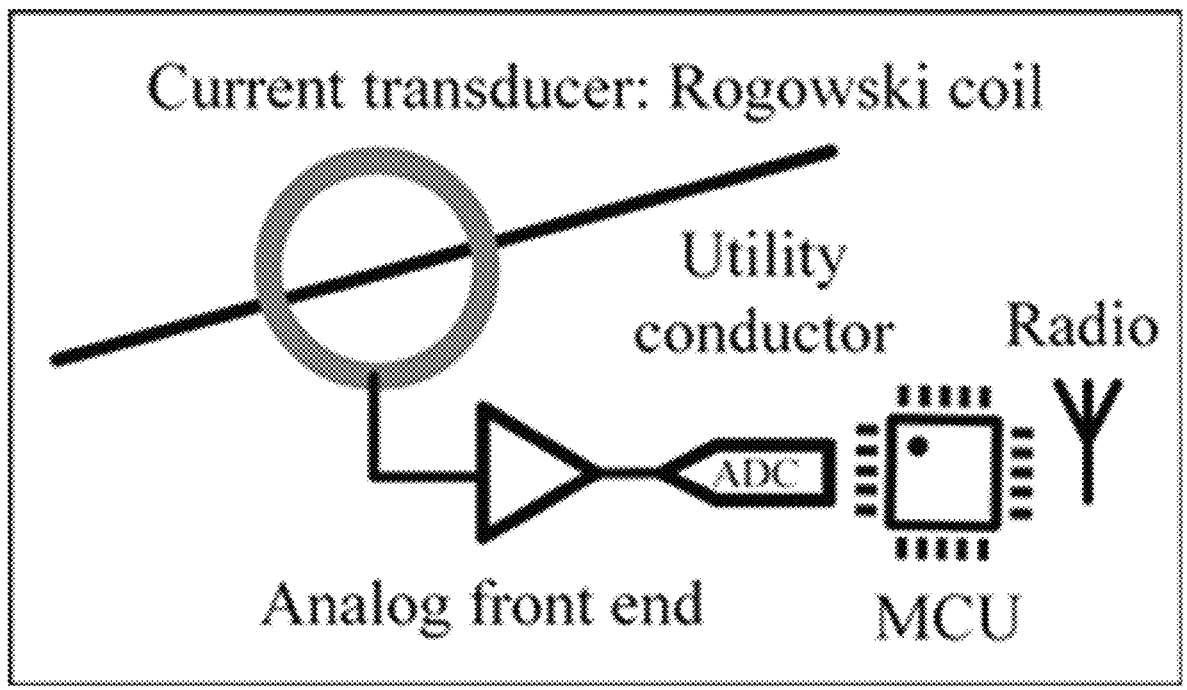
FIG. 1 provides a schematic of a Rogowski coil used in various embodiments of the present disclosure.
Figure 2:
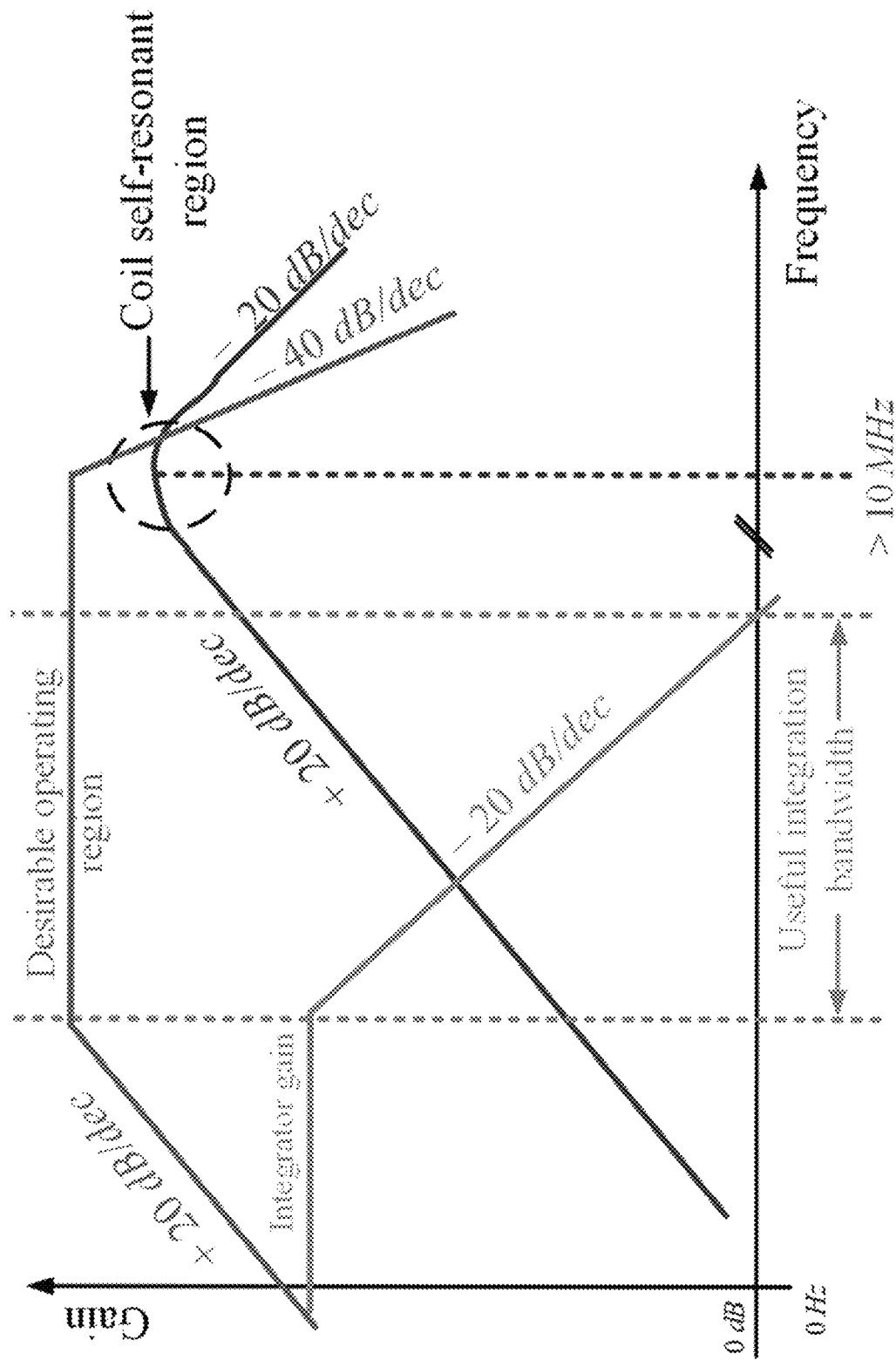
FIG. 2 provides a plot of the frequency response of a PCB-based Rogowski coil an integrator, and a combined integrator and coil.
Figure 3:
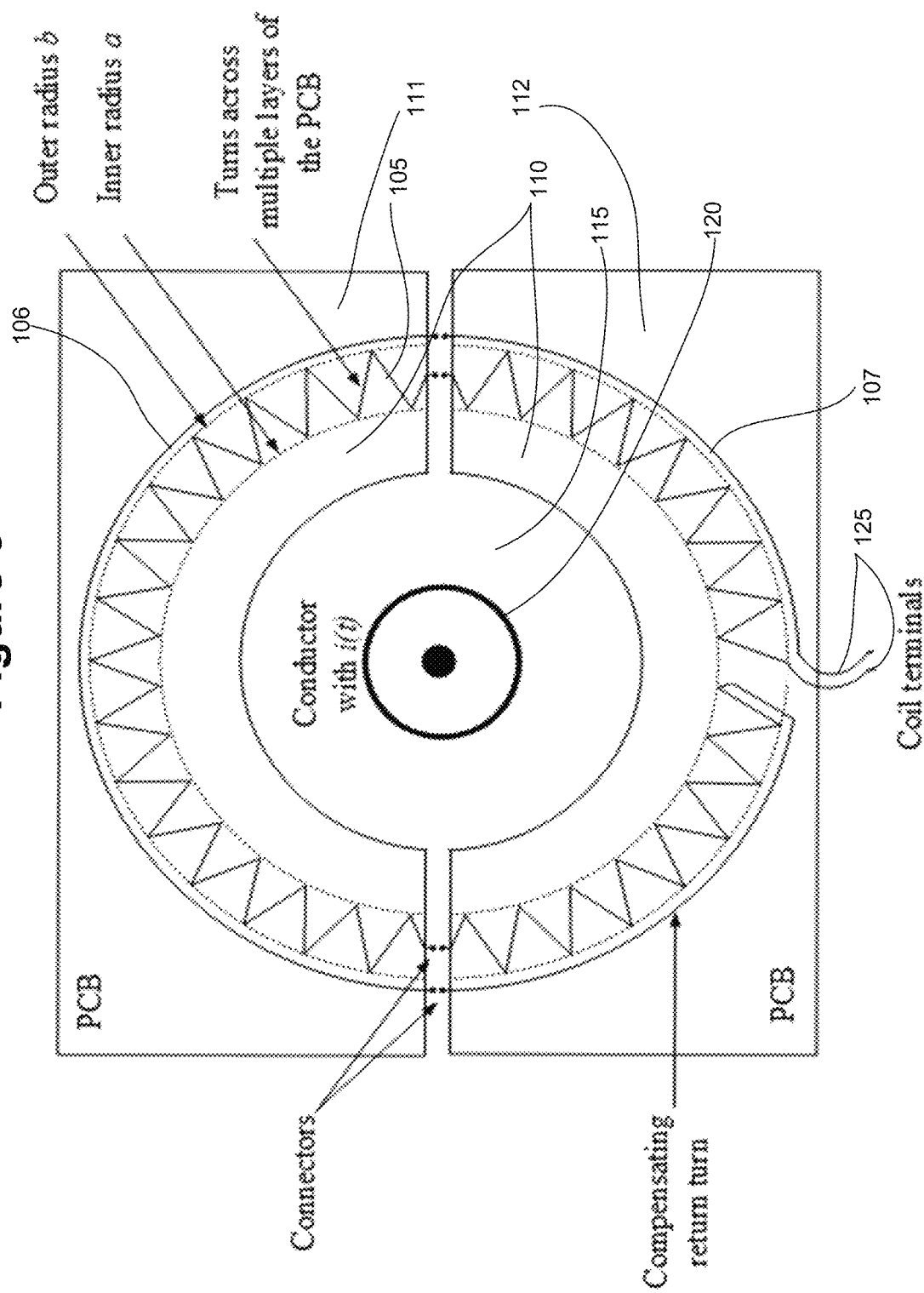
FIG. 3 provides a schematic of a current sensor, in accordance with an exemplary embodiment of the present disclosure.
Figure 6A:
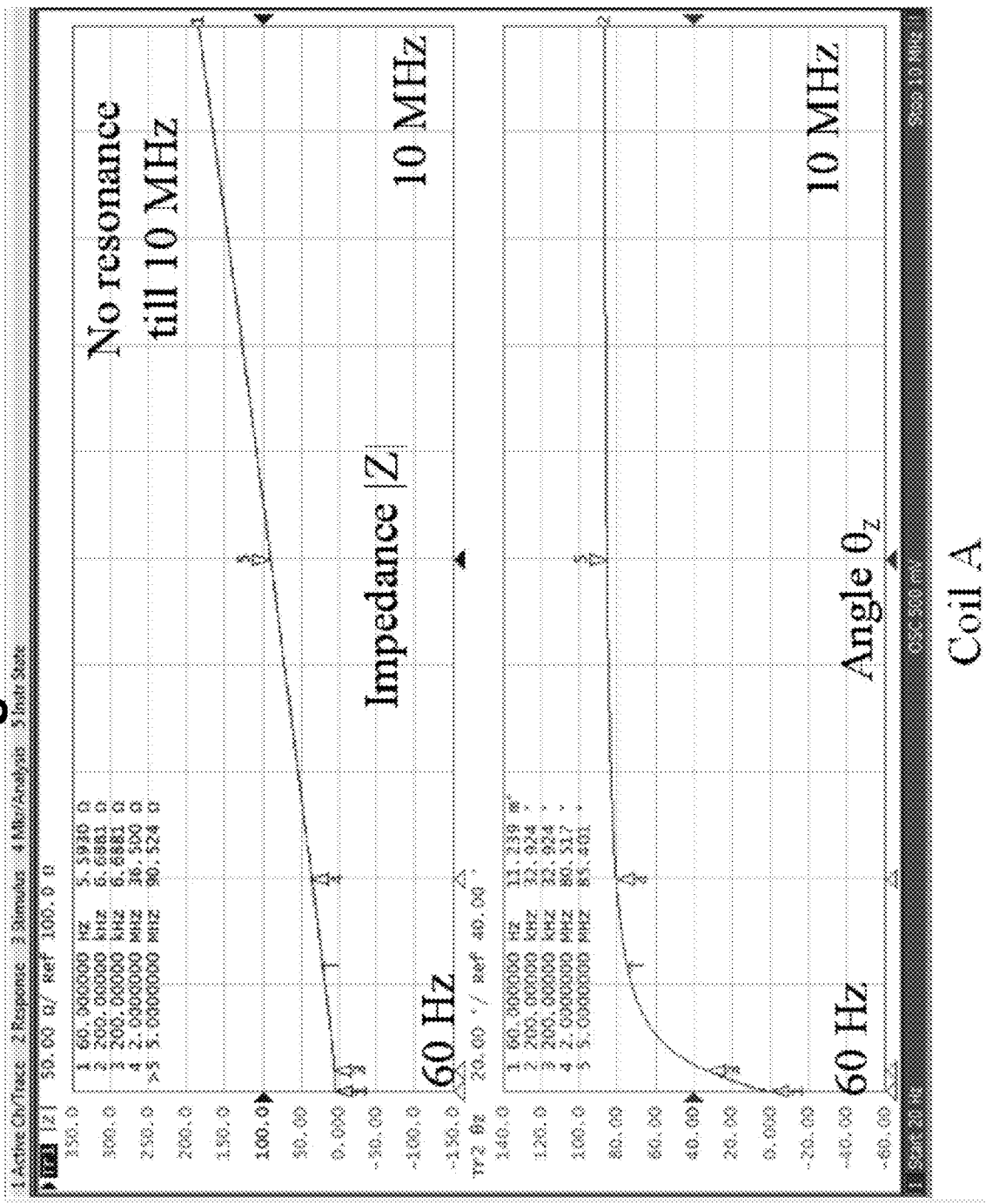
FIGS. 6A-D provide plots of the impedance trends of the unloaded current sensors shown in FIG. 5.
Figure 6B:
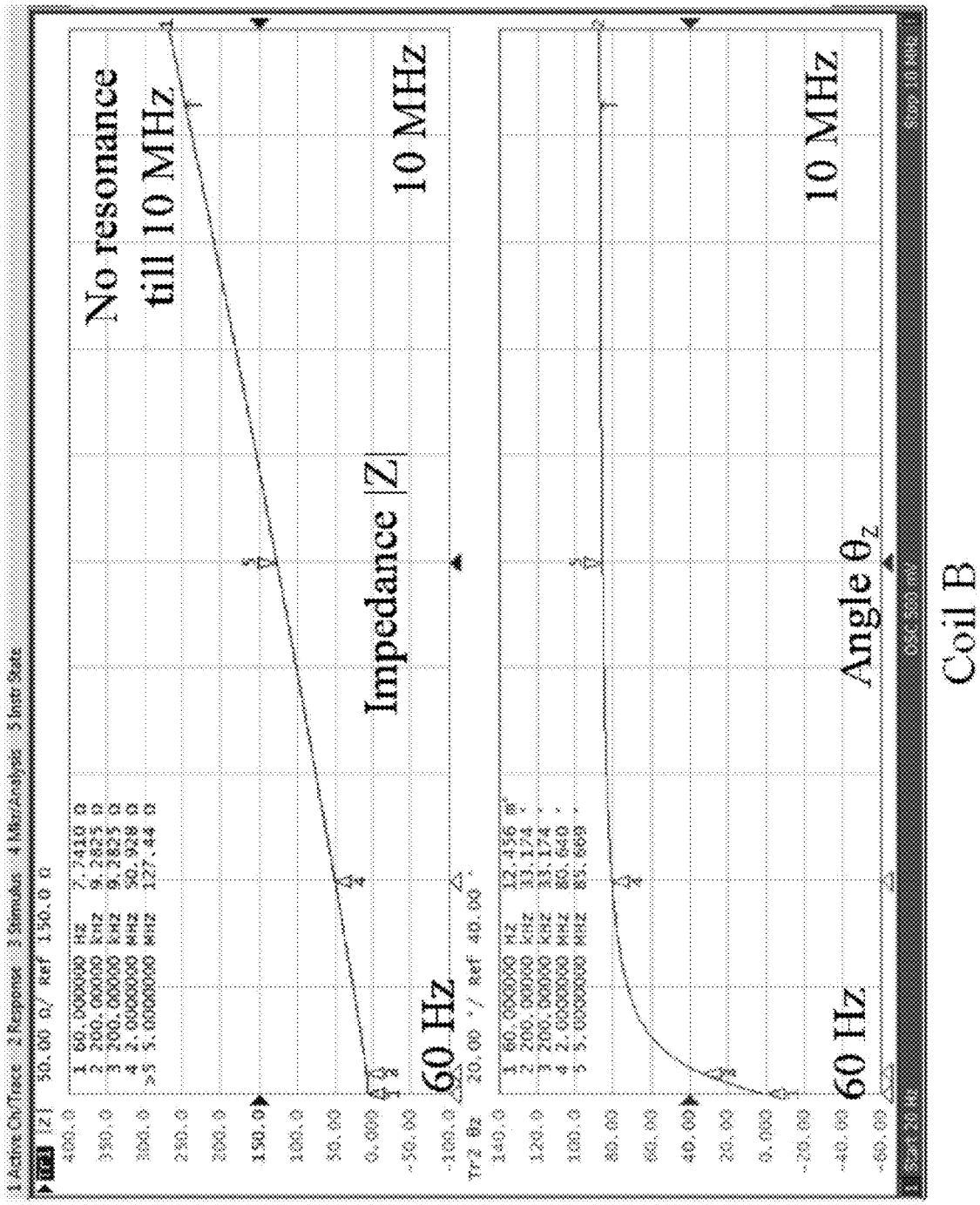
Figure 6C:
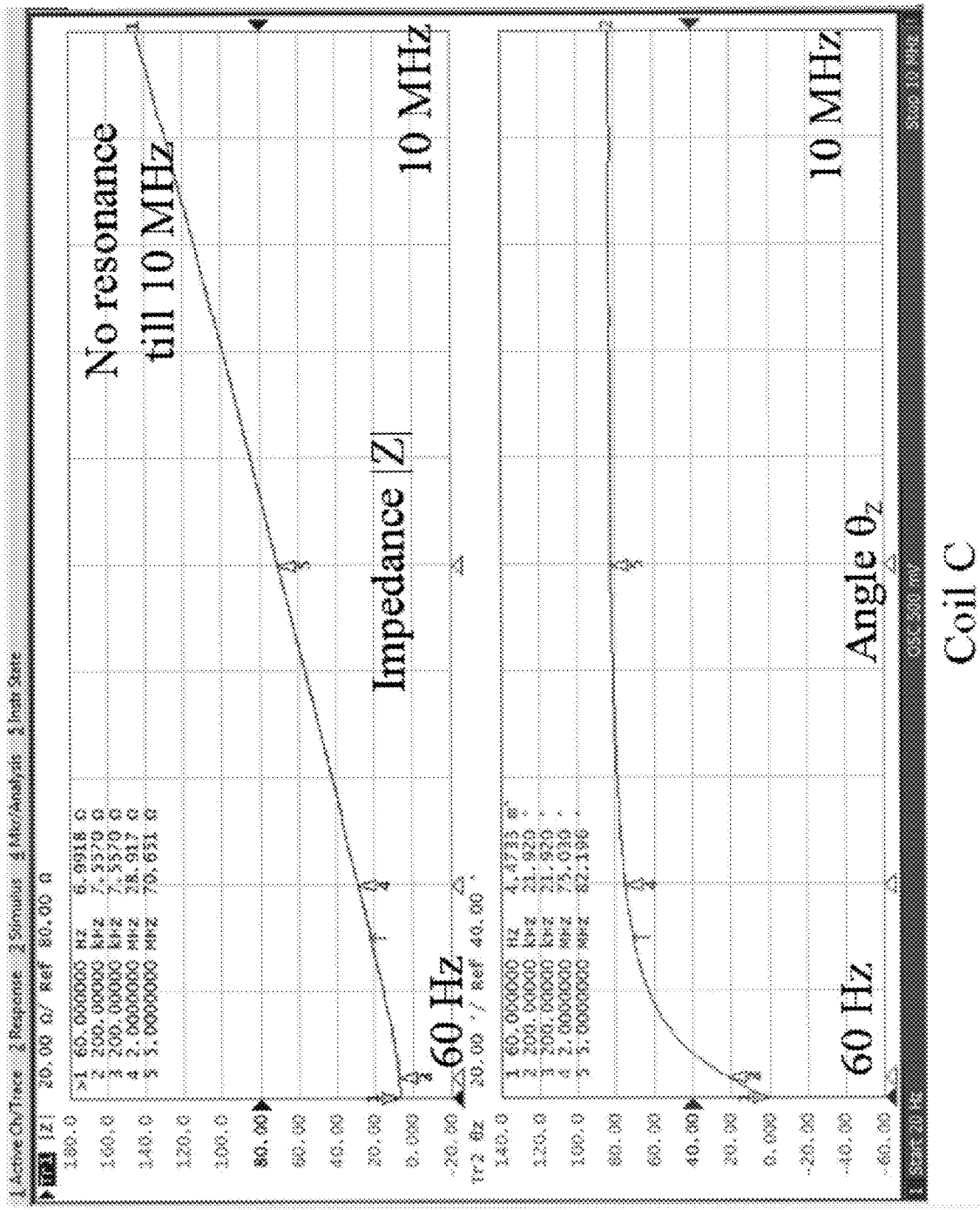
Figure 6D:
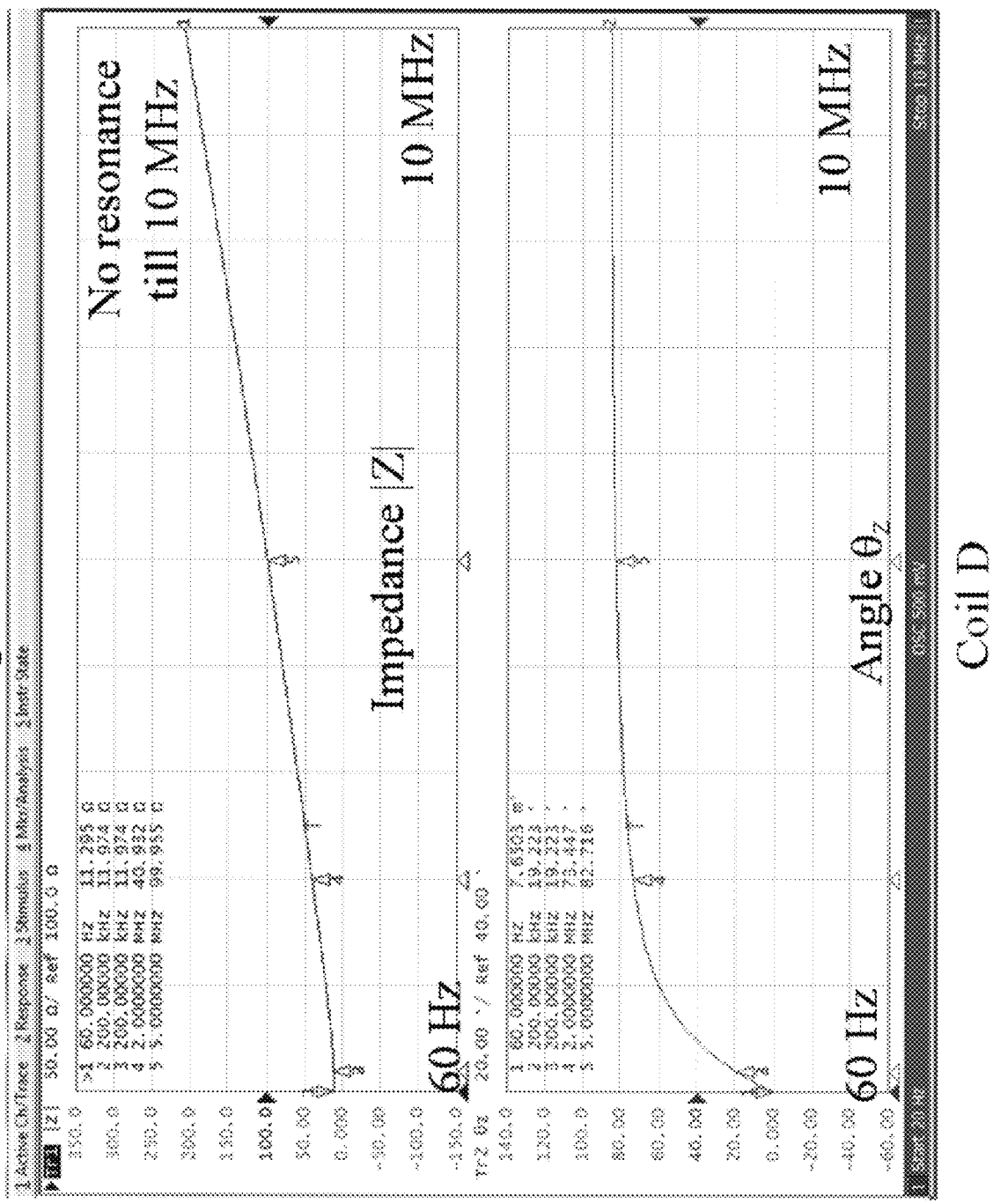

As shown in FIG. 3, various embodiments of the present disclosure include a Rogowski coil 105 positioned on a substrate 110. The substrate 110 can be many different substrates. In an exemplary embodiment, the substrate 110 can be a printed circuit board (PCB). In some embodiments, the PCB comprises multiple layers.

The substrate can comprise an aperture 115. The aperture 115 can be configured to permit a conductor 120 to pass therethrough. As shown in FIG. 3, the Rogowski coil 105 can be positioned along the perimeter of the aperture 115. For example, the coil traces can be embedded in the substrate 110. The Rogowski coil 105 can have an inner radius and an outer radius. As also shown in FIG. 3, the coil 105 can comprise coil terminals 125. When the conductor 120 passing through the aperture 115 carries an alternating electrical current, the Rogowski coil 105 can generate an analog voltage signal at the coil terminals 125 proportional to the magnitude of the current carried by the conductor 120.

The substrate 110 can be either a continuous piece, meaning the conductor 120 is typically inserted through the aperture 115, or the substrate can be a "clip-on," which is shown in FIG. 3. In the "clip-on" configuration, the substrate 110 comprises a first portion 111 and a second portion 112. A first portion of the Rogowski coil 106 can be positioned on the first portion of the substrate 111, and a second portion of the Rogowski coil 107 can be positioned on the second portion of the substrate 112. In some embodiments, the first and second portions of the substrate 111, 112 can comprise one or more connectors (not shown) for detachably connecting the portions 111, 112 together. The connectors can be many different connectors known to those skilled in the art. Thus, the first and second portions of the substrate 111, 112 can be separated from each other and positioned around an existing conductor 120. The first and second portions 111, 112 can then be connected to each other, such that the first and second portions of the Rogowski coil 106, 107 are in electrical communication with each other. The "clip-on" configuration can be beneficial for measuring current carried by a conductor 120 without having to disconnect one end of the conductor 120 and run it through the aperture 115, i.e., operation of the conductor 120 is uninterrupted.

As discussed above, various current sensors of the present disclosure make use of Rogowski coils. Specifically, various embodiments employ a printed circuit board (PCB) which has coil traces embedded therein forming a toroidal structure. The top view and side view of such a PCB are shown in FIG. 4A (with an equivalent circuit shown in FIG. 4B). If h is the thickness of the PCB, and a, b, are the inner and outer diameters of the PCB coil, a closed form expression can be derived, relating the mutual inductance of the primary current-carrying conductor to the coil as shown in Equation 1:

$$H = \frac{i_p}{2\pi x} \Rightarrow B = \mu_0 \cdot \frac{i_p}{2\pi x} \qquad \text{Equation 1}$$

where H is the magnetic field strength, B is the magnetic flux density and $\mu_0$ is the permeability of free space, $4\pi\ 10^{-7} H/m$ $$\phi = \int_{a/2}^{b/2} B \cdot dA = \int_{a/2}^{b/2} \frac{\mu_0 \cdot i_p}{2\pi x} \cdot h \cdot dx = \frac{i_p \mu_0 h}{2\pi} \cdot \ln\left(\frac{b}{a}\right) \qquad \text{Equation 2}$$

With N number of turns on the PCB; by Faraday's law, voltage induced on the coil, $v_o$ is shown in Equation 3:

$$v_0 = -N \cdot \frac{d\phi}{dt} = -N \cdot \frac{\mu_0 h}{2\pi} \cdot \ln\left(\frac{b}{a}\right) \cdot \frac{di_p}{dt} \qquad \text{Equation 3}$$

The mutual inductance M, can be represented by Equation 4:

$$M = -N \cdot \frac{\mu_0 h}{2\pi} \cdot \ln\left(\frac{b}{a}\right) \quad \text{Equation 4}$$

Typically, for power line applications, Equation 5 holds true:

$$i_p(t) = i_o e^{j\omega t} \Rightarrow v_o(t) = -Nj\omega \frac{\mu_0 h}{2\pi} \ln\left(\frac{b}{a}\right) i_o e^{j\omega t} \quad \text{Equation 5}$$

It can be seen that the voltage induced varies directly with the frequency of the primary current, making the Rogowski coil suitable for high frequency current measurements, as $v_o$ is proportional to $\omega$.

The frequency characteristics of the coil also depend on the lumped parameters. The coil can be approximated as an LCR circuit and the self-inductance $L_s$ and series resistance $R_s$ can be estimated as shown in Equations 6 and 7:

$$L_s = \frac{N^2 \mu_0 h}{2\pi} \ln\left(\frac{b}{a}\right) \quad \text{Equation 6}$$

$$R_s = 2N\rho \frac{d_l}{d_h \cdot d_w} \quad \text{Equation 7}$$

where $\rho$ is the electrical resistivity of PCB traces (for copper, $\rho = 1.68 \times 10^{-8}$ Ω m), $d_l$, $d_h$ and $d_r$ are length, height and width of PCB traces and $t$:$_0$ is the permittivity of free space, $8.854 \times 10^{-12}$ F/m.

A closed-form expression for the lumped capacitance $C_s$ for a PCB embedded coil can be derived from finite element methods, and measured values are used in the model presented herein.

It is evident that the bandwidth of a PCB-based coil itself is greater than several hundred kHz as determined by the lumped parameters, $L_s$ and $C_s$. The resonant frequency $f_r$ is shown in Equation 8:

$$f_r = \frac{1}{2\pi\sqrt{L_s C_s}} \quad \text{Equation 8}$$

Based on these principles, four PCB embedded coils were manufactured to compare the performance. These coils are shown in FIG. 5. Two of these coils (coils A and B) had a closed structure and were identical to each other, with only the PCB thickness being different. Coils C and D were "clip-on" Rogowski coils (discussed below), with similar structures but different number of turns.

For the parameters of the coils shown in FIG. 5, experimental data using an impedance analyzer (FIGS. 6A-D) on the four constructed coils show that $f_r > 10$ MHz, making them suitable for us in frequencies up to 1 MHz. The expected values using Equations 4-8 and measurement results from an impedance analyzer are provided in Table 1.

TABLE I

COMPARISON OF EXPECTED AND MEASURED PARAMETERS OF THE PRINTED COIL AT f = 60 Hz

| Parameter | Coil A Expected | Coil A Measured | Coil B Expected | Coil B Measured | Coil C Expected | Coil C Measured | Coil D Expected | Coil D Measured |
|---|---|---|---|---|---|---|---|---|
| $L_S$ | 3.552 µH | 3.375 µH | 5.645 µH | 5.986 µH | 2.255 µH | 2.238 µH | 2.96 µH | 3.103 µH |
| $R_S$ | 5.95 Ω | 5.59 Ω | 7.798 Ω | 7.358 Ω | 7.358 Ω | 7.045 Ω | 10.72 Ω | 11.392 Ω |
| $C_S$ | N/A | 7.4 pF | N/A | 15.2 pF | N/A | 5.799 pF | N/A | 5.281 pF |
| M | 16.2 nH | 17 nH | 41.27 nH | 44.78 nH | 15.68 nH | 15.5 nH | 19.61 nH | 19.91 nH |
| $f_r$ | 39.3 MHz | >10 MHz | 21.18 MHz | >10 MHz | 44.18 MHz | >10 MHz | 39.31 MHz | >10 MHz |

Figure 7:
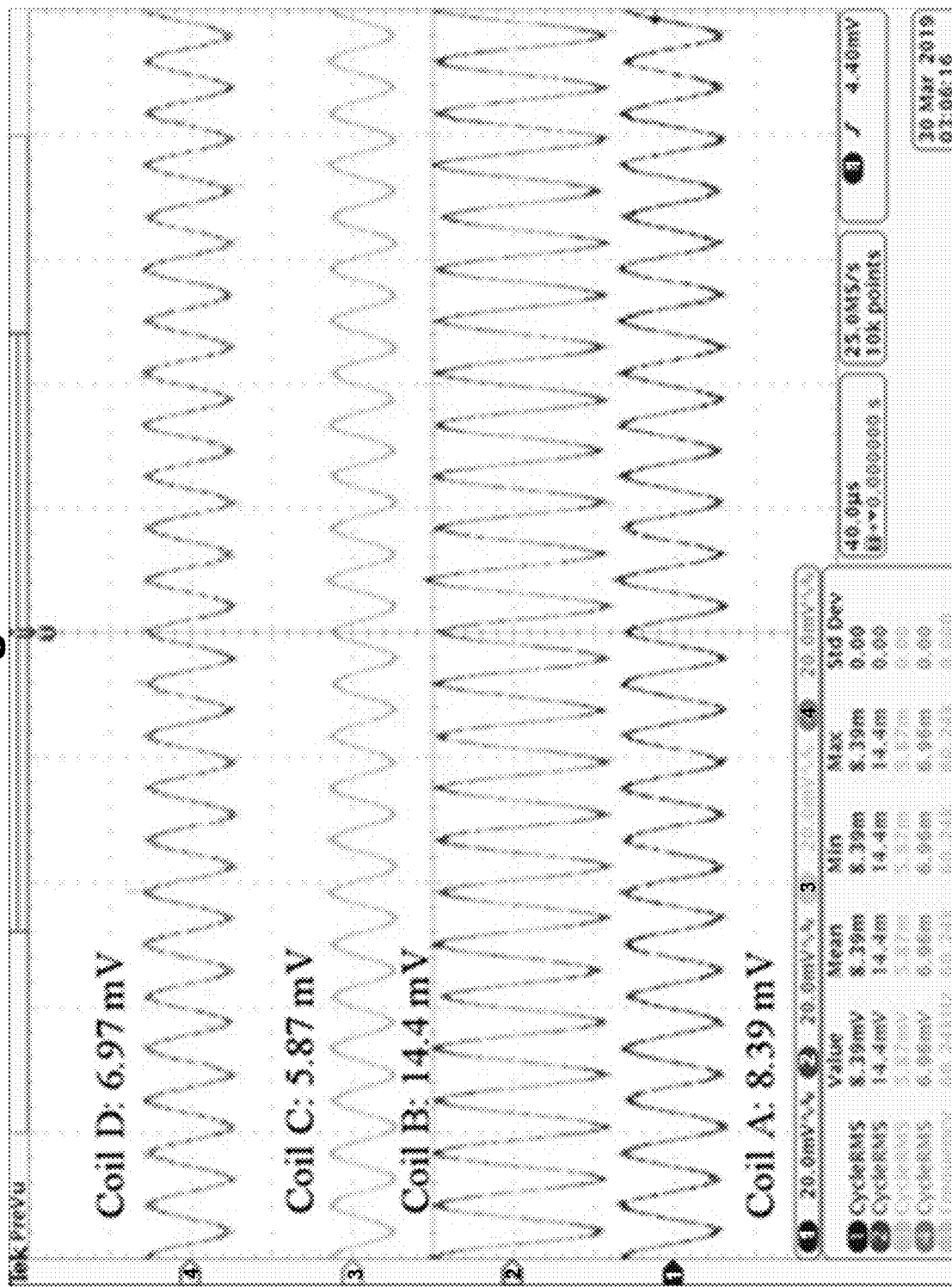
FIG. 7 provides a plot of the coil outputs of the four sensors shown in FIG. 5 when excited by primary current of 1.2 $A_{RMS}$ at 60 kHz.
Figure 8:
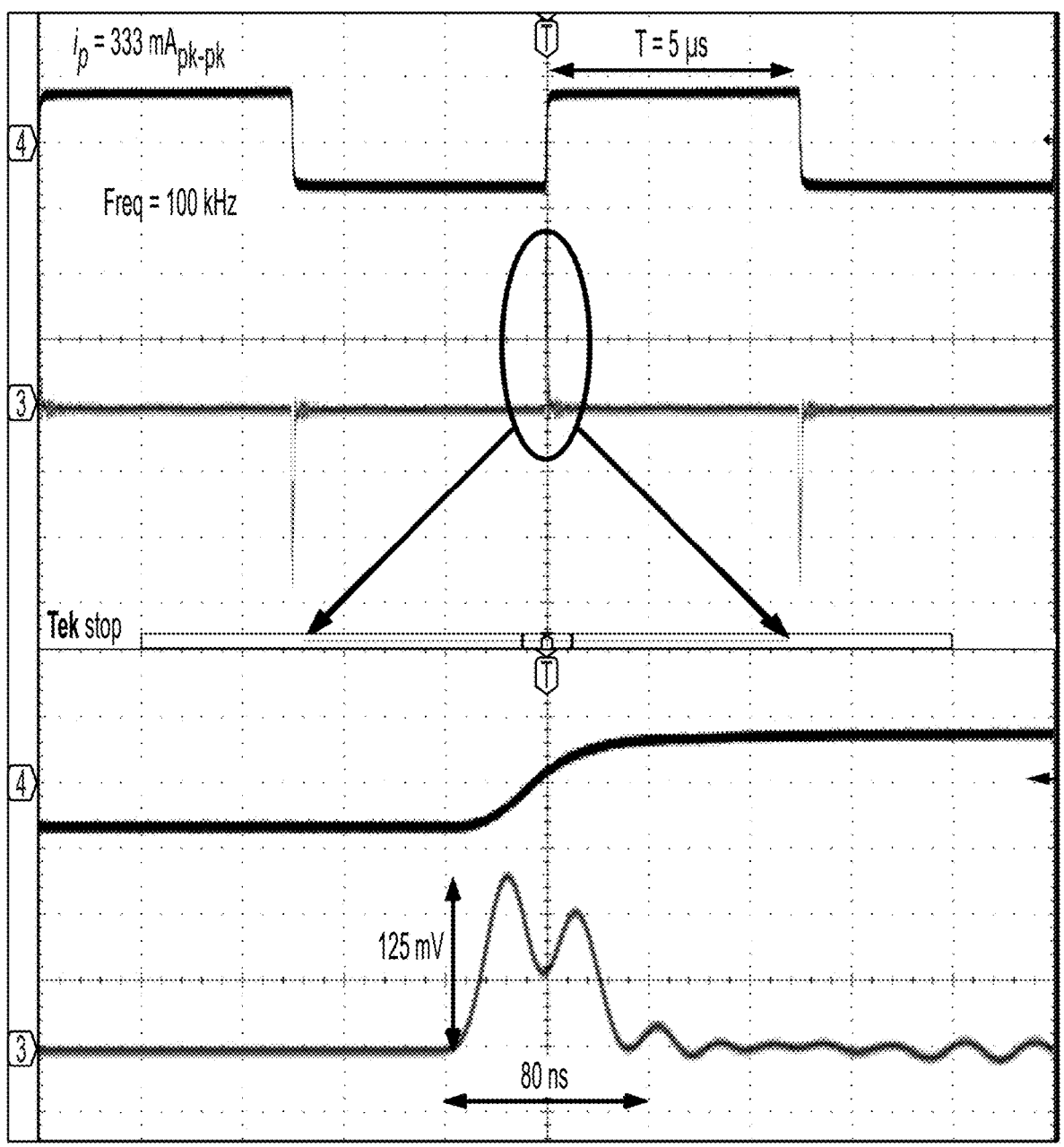
FIG. 8 provides a step response of Coil D from FIG. 5 for a 100 kHz 333 $mA_{pk}$ square wave primary current.

To evaluate the performance of the coils, they were excited with the same current ($i_p = 1.2$ A$_{RMS}$ at 60 kHz) and the coil output voltage (Mdi$_p$/dt) compared. FIG. 7 shows that the responses of the clip-on coils are comparable to the closed core coils, with the mutual inductance M being the dominant governing factor. It can be concluded that the clip-on versions (coils C and D) are equivalent to the PCB-based coils (coils A and B). The step response for coil D is shown in FIG. 8, showing a fast setting di$_p$/dt output for an excitation current of $i_p = 333$ mA$_{pk-pk}$.

For a Rogowski coil with an air gap without any compensation, the mutual inductance M varies as little as 3.52% when the conductor is near the airgap. It also has little variation in other arbitrary locations inside the coil which is confirmed from our findings.

Figure 9:
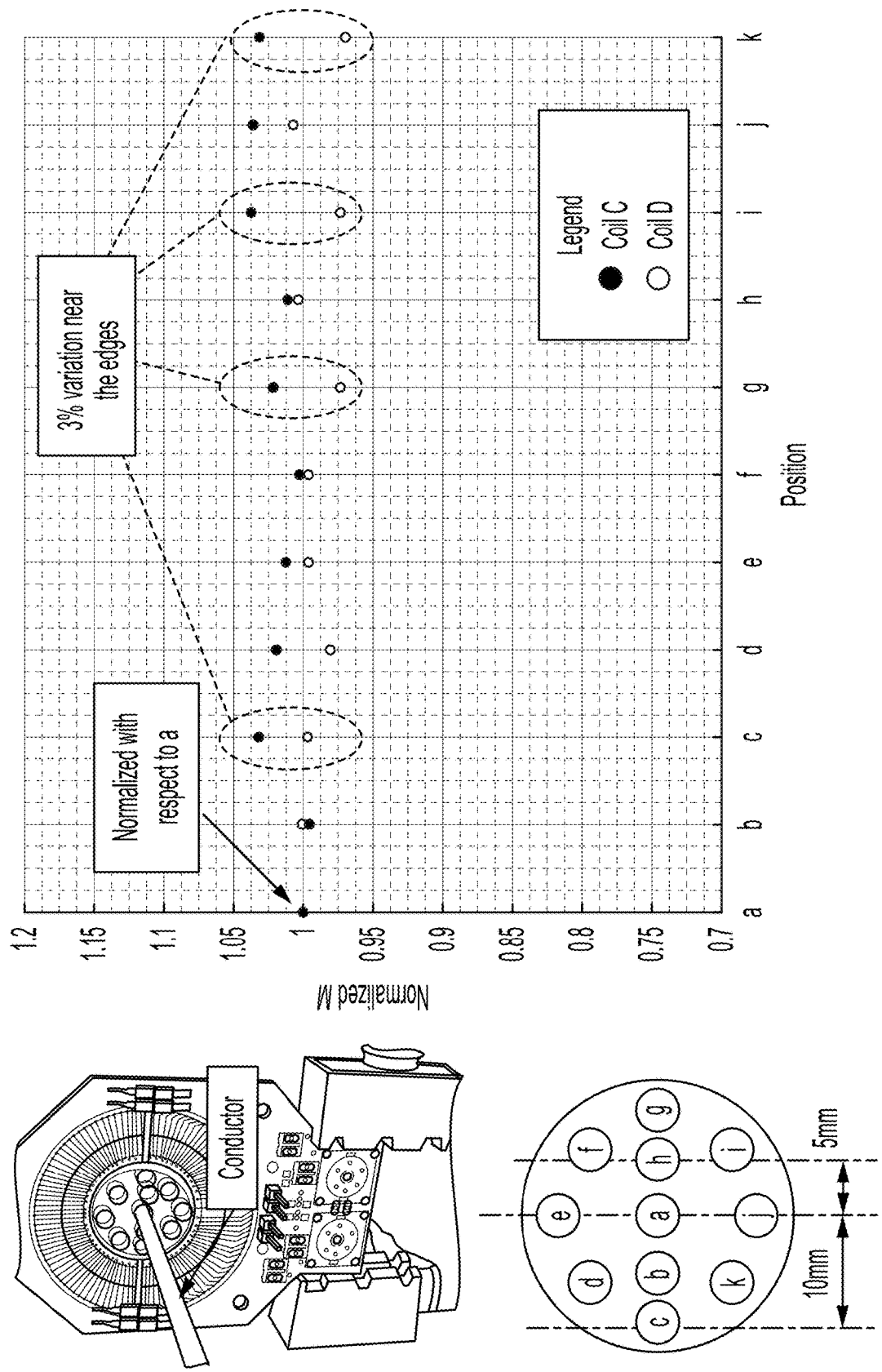
FIG. 9 illustrates variation of the mutual inductance M with conductor position inside the coils C and D of FIG. 5.

A test to measure the variation of the mutual inductance due to the conductor position within the coil was carried out. The test setup is shown in FIG. 9, with the positions marked. Based on the primary current excitation and Rogowski coil output voltage, mutual inductance was measured using Equations 4 and 5. It was seen that the normalized mutual inductance M varied within ±3% as the position of the conductor was changed. However, it is important to note that the exemplary sensor was designed for utility grade cables (ACSR or 1/0 gauge), so that the positional variance is minimal.

The experimental results show that the open-core, clip-on configuration (used in coils C and D) has a performance comparable to that of the closed core designs (used in coils A and B). It can also be seen that the connectors do not introduce significant noise or parasitics into the lumped model of the Rogowski coil, as concluded from Table 1. It can also be seen that the dynamic performance is within specifications, making the clip-on configuration beneficial for a wide bandwidth application.

As shown in FIG. 9, current sensors of the present disclosure can also comprise a controller. The controller can comprise components for processing the analog signal generated by the Rogowski coil. The controller can comprise an analog circuit, an analog-to-digital converter (ADC), and a microcontroller unit (MCU) (or microprocessor). The analog circuit can be divided into three sections: a front-end amplifier, a low noise integrator, and an adaptive programmable gain amplifier.

Front End Amplifier: Rogowski coils can be very sensitive (e.g., approximately 25.45 μV/A at 60 Hz), the signal generated by the coil can be first amplified, before integrating it. This can be achieved by a programmable gain instrumentation amplifier, to remove any common mode noise, offset error, and unwanted signal couplings. To match the Rogowski coil's sourcing capability, this stage is desirably a high impedance input stage. Hence, in an exemplary embodiment, an instrumentation amplifier with 0.15 nA bias current was chosen, and converted into a programmable gain amplifier with the use of solid-state analog switches, with an ultra-low insertion loss. The dynamic range added due to this stage is 1:1000, i.e. +0 to +60 dB.

Low Noise Integrator: The front-end amplifier can condition the incoming di/dt signal and feed it into a low-noise, low-drift integrator circuit, tuned for operation over a frequency range, e.g., 20 Hz to 15 kHz. Op-amps with ultra-low offset voltage can be used to minimize the drift. Additionally, a high-pass filter stage can be used to remove any remnant DC offset that can cause distortions in the signal.

Adaptive Programmable Gain Amplifier: In the third state of the analog circuit, a programmable gain amplifier (PGA) can be used to condition the signal for the ADC. The PgA can be digitally controlled over a gain range, e.g., 0.125 to 176, which can add another 1:1400 to the dynamic range (i.e., −18 to +45 dB). In addition to the gain, this stage can level-shift the signal and center it around half of the voltage rail (+1.65V), setting it up for both single ended and differential ADCs.

Figure 10:
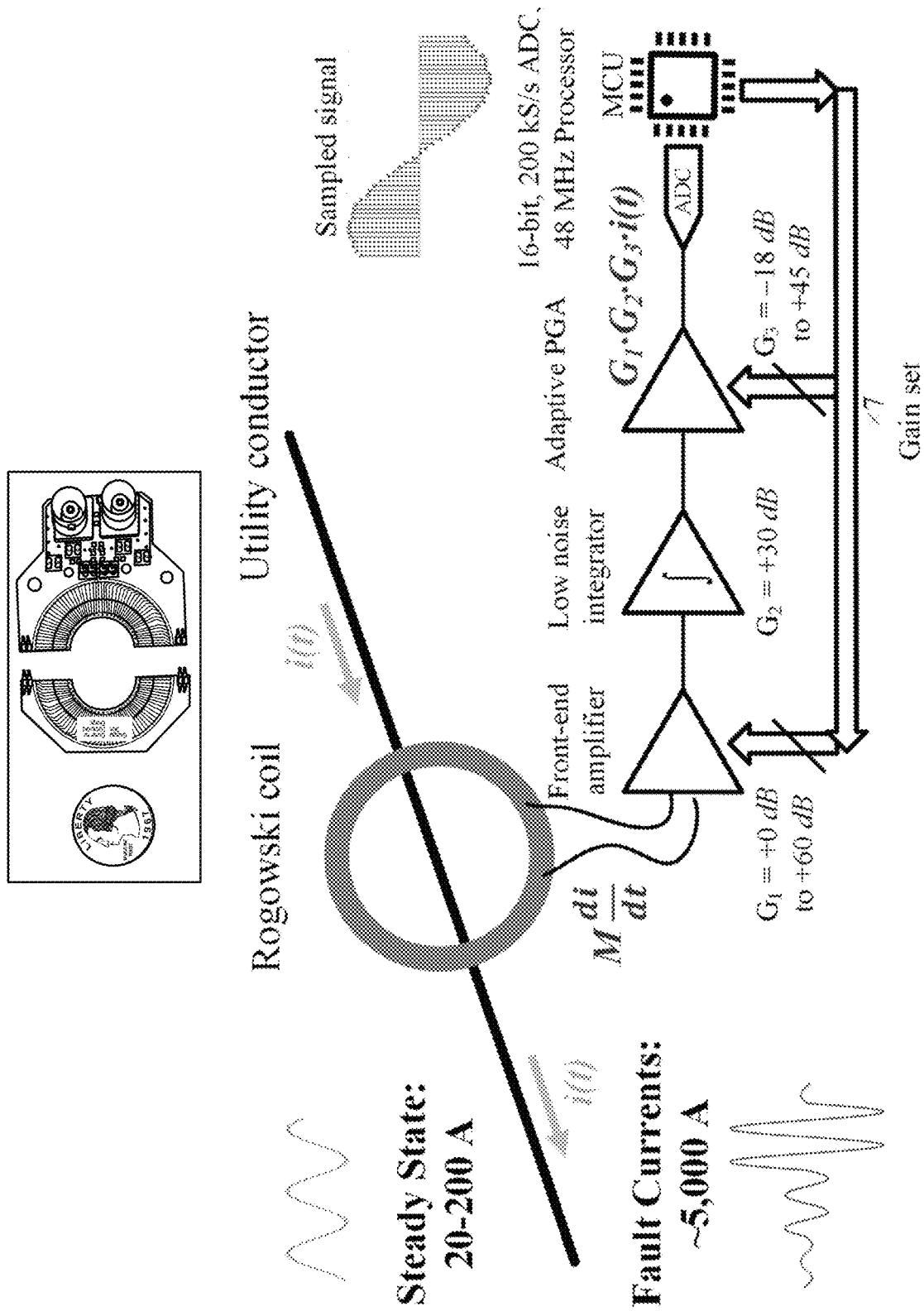
FIG. 10 illustrates a block diagram of an exemplary current sensor, in accordance with exemplary embodiments of the present disclosure.

Analog-to-Digital Conversion and Microcontroller: In the exemplary sensor shown in FIG. 10, the MCU used was the mixed signal processor MSP432P401R which has ultra-low power consumption, fast speed (48 MHz), and excellent ADC integration. The on-board ADC has a successive approximation architecture, featuring up to 200 kS/s sampling rate. For the purpose of the experiment, it has been configured to sample at 10 kHz and a 10 oversample and average architecture to generate and store the waveform data (16 samples/cycle) to the on-board flash memory in a cyclic memory buffer.

The specifications for the exemplary analog design are summarized in Table II. The sensor can achieve −18 to +105 dB range correction to the incoming current waveforms. The MCU can capture data from the ADC and drive the gains for the preceding stages through seven general purpose I/Os. An exemplary algorithm for driving the gains is discussed below.

TABLE II

SENSOR SPECIFICATIONS

| Parameter | Value | Notes |
|---|---|---|
| Rogowski coil sensitivity | 0.42 μV/A-Hz or 25.45 μV/A @ 60 Hz | Rogowski coil's sensitivity for generating di/dt signals based on enclosed currents |
| Bandwidth | 20 Hz to 15 kHz | Accommodates 20+harmonics at power line frequencies and can work with switching power supplies too |
| Settling time @ 60 Hz | 40 ms | Integrator settling time when switching gain abruptly |
| Phase error @ 60 Hz | 2° | Within metering grade accuracy |
| Settling, time @ 600 Hz | 9 ms | Integrator settling time when switching gain abruptly |
| Resolution | 14-bit successive approximation ADC | Actual measurement resolution is governed by the gain setting and the DRC algorithm |
| Gain switching time | 400 ns | Gain transition time satisfies high speed switching requirements |

In various embodiments of the present disclosure, the gain applied to the analog signal generated by the Rogowski coil can be varied allowing for the sensor to achieve a high resolution while maintaining a high degree of accuracy. For example, in some embodiments, the current sensor can be configured to measure the alternating electric current relative to a full scale at a resolution of 1000:1 and at an accuracy within 1%, wherein the full scale can range over 5000:1.

As used herein, "full scale" refers to the maximum current that the combination of the signal conditioning circuit and the data acquisition stage of the sensor can support while functioning without non-linearity or distortions. The "resolution of 1000:1" defines the range of discrete, valid measurements that can be successfully made with the help of the data acquisition stage. A "resolution of 1000:1" refers to 1000 discrete steps in which the measurements can be assigned a digital or discrete value using the data acquisition stage. "Accuracy within 1%" sets an upper bound on the error to be 1% of true value when operating at rated, full scale of the current. The phrase "full scale can range over 5000:1" refers to the fact that the adaptive signal conditioning stage can vary the full scale of operation over a range from 1× to 5000×.

For example, let an embodiment of the sensor be configured to measure full scale of 10 amperes at a resolution of 1000:1 and at within 10% accuracy. This indicates that the maximum current that can be measured with the sensor is 10 amperes, and the minimum current measured is 0.01 amperes. With 1% accuracy, the maximum error when measuring 10 amperes current is 0.1 amperes. With the adaptive signal conditioning, the full scale (i.e., the maximum measurable input) can be varied over a range of 5000:1 indicating that the sensor can change the full scale from 10 amperes to 50,000 amperes, while maintaining the 1% accuracy, i.e. maximum error of 500 amperes at the full scale of 50,000 amperes and a resolution of 1000:1, i.e. being able to measure 50 amperes as the lowest measurement.

Figure 11:
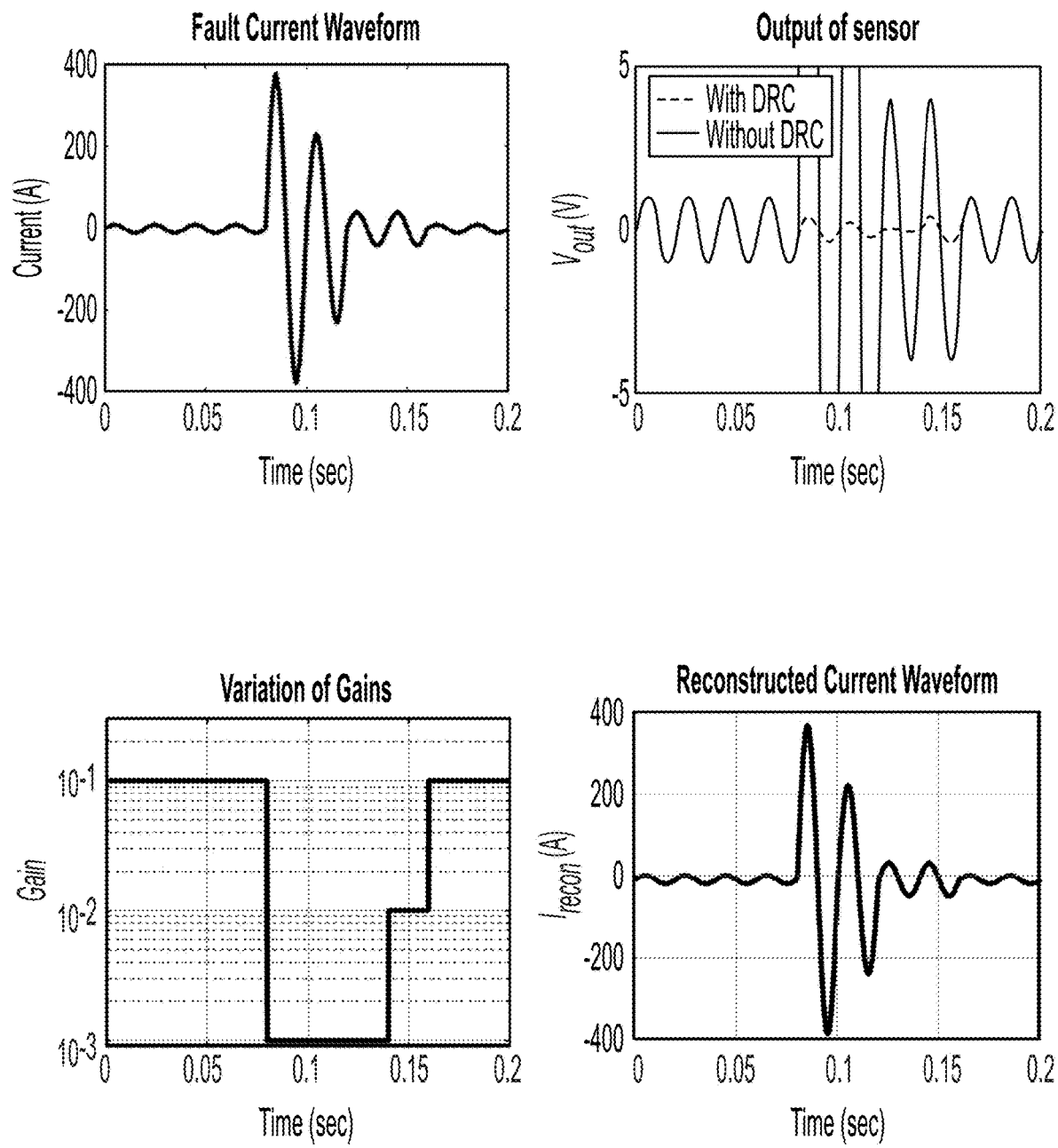
FIG. 11 illustrates a dynamic range correction process, in accordance with exemplary embodiments of the present disclosure.
Figure 12:
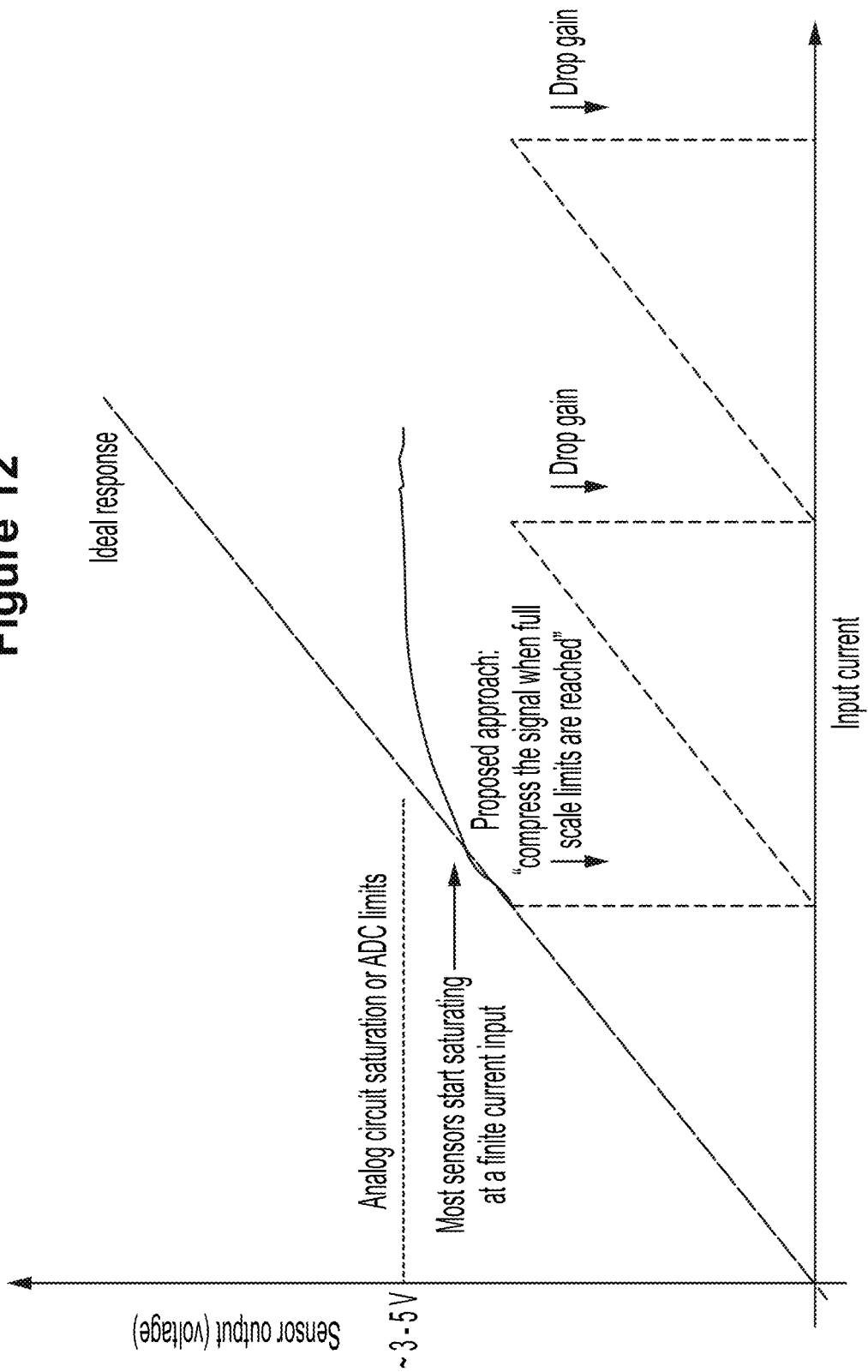
FIG. 12 illustrates the effect of gain variance during a dynamic range correction process, in accordance with exemplary embodiments of the present disclosure.

In some embodiments, the gain applied to the analog signal generated by the Rogowski coil can be varied using a Dynamic Range Correction using Edge Intelligence. The Dynamic Range Correction method can adjust the gain of the analog circuits so that the current being measured is mapped into the full-scale range of the ADC (e.g., 0-3.3V), especially when the current changes drastically in fault scenarios. An illustration of this concept is shown in FIG. 11, where the current changes suddenly from 14 $A_{pk}$ to 400 $A_{pk}$. In this scenario, with a finite rail to rail swing on the analog integrator, the analog stage can saturate and clip the signal, resulting in distortion. However, by dynamically adjusting the gains of the analog stage, to match the current levels, the analog signal can be "compressed" to maintain the signal within rail to rail swing, and can be "uncompressed" during post-processing. This effectively creates a mapping between the input current i(t) and the sensor output voltage v(t) and can be used to switch the gains as shown in FIG. 12. However, in some embodiments, magnitude alone is not used for range correction because it can lead to chattering. Thus, in some embodiments, the di/dt information can also be used, as follows:

Consider a steady state input current i(t) flowing in the utility conductor. From Equation 5 voltage induced in the Rogowski coils is $v_o(t)=M \cdot di(t)/dt$. The integrator with a gain G produces an output represented in Equation 9:

$$v(t) = \int G.M. \frac{di(t)}{dt} = G.M.i(t) \Rightarrow \frac{dv}{dt} = K\frac{di}{dt} \quad \text{Equation 9}$$

Figure 13:
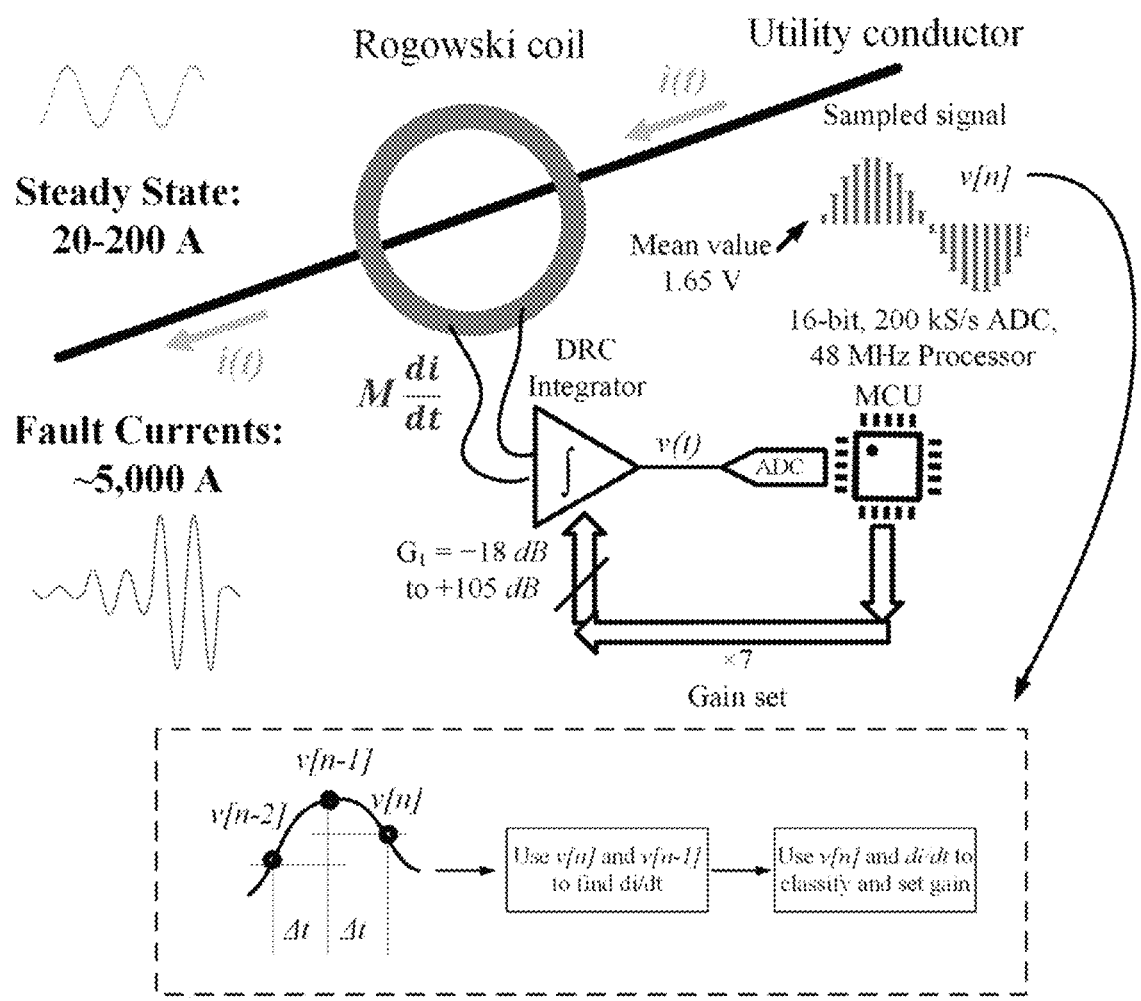
FIG. 13 illustrates a dynamic range correction process in a current sensor, in accordance with exemplary embodiments of the present disclosure.

It can be seen that the integrator output dv/dt is related to the incoming di/dt through a constant, K which is the overall gain of the system. Thus, when the incoming di/dt changes drastically (e.g., increases above a predetermined threshold) in the event of a fault, the MCU can calculate dv/dt, and knowing the gain of the integrator, estimate the current level on the primary conductor. Based on these values, a new gain can be calculated so that the analog stage does not saturate, as shown in FIG. 13.

The dv/dt can be calculated in the discrete domain by $dv/dt=(v[n]-v[n-1]) \cdot f_s$ where $f_s=10$ KS/s; and used to generate the next gain value G[n+1], which depends on the present gain value G[n], the RMS trend of the voltage $v_{rms}$ and the calculated dv/dt. There can exist a pre-set mapping of gains corresponding to different current levels for which the current variation maps into the full-scale range of the ADC. For instance, $i(t) \in [1, 10]$ A $\Rightarrow dv/dt \in [K \cdot \omega, 10 \cdot K \cdot \omega]$; $i(t) \in [10, 100]$ A $\Rightarrow dv/dt \in [10 \cdot K \cdot \omega, 100 \cdot K \cdot \omega]$ and so on. The MCU then sets the gain K so that v[n−1] will be maintained within 0-3.3V. This exemplary procedure is summarized in Algorithm 1. Thus, the exemplary sensor can intelligently detect high di/dt signals and adjust the gain to obtain full scale mapping to the ADC.

| Algorithm 1 Algorithm for Dynamic Range Correction |
|---|
| Input from ADC: Sample at the n<sup>th</sup> instant, v[n] |
| Input from Memory: N previous samples: v[n − 1], v[n − 2],...v[n − N] |
| Repeat: |
| 1:   Use v[n] and v[n − 1] to compute dv/dt |
| 2:   Calculate di/dt using dv/dt and present gain $G_i$ |
| 3:   use {v[n], v[n − 1]...v[n − N]} to find $v_{rms}$ |
| 4:   Use $v_{rms}$ and G[n] to find i(t) |
| 5:   Using di/dt, G[n] and i(t) classify i(t) into normal mode or fault mode |
| 6:   if fault mode then |
| 7:     Pick appropriate lower gain for G[n = 1] corresponding to di/dt computed |
| 8:     Trigger a waveform capture mode & save sampled data to special section of memory |
| 9:   else |
| 10:     Ensure G[n = 1] is suitable for present i(t) |
| 11:   end if |

Sensors disclosed herein can also include a transceiver. The sensors can use the transceiver to communicate with a remote device. In some embodiments the transceiver is a wireless transceiver, i.e., a transceiver configured to communicate with a remote device (e.g., remote computer, server, cloud, and the like) via a wireless signal. In some embodiments, the sensor can receive a command signal from a remote device, which can indicate the sensor should transmit a response signal to a remote device indicative of the current measured by the current sensor. In some embodiments, the current sensor can be configured to transmit such a signal to a remote device according to a predetermined schedule.

Sensors disclosed herein can also include a power supply to provide electrical power to the current sensor. The power supply can be many power supplies known in the art, including, but not limited to, batteries, a solar panel, wired connection to an electrical grid/generator, and the like.

Example

Figure 14C:
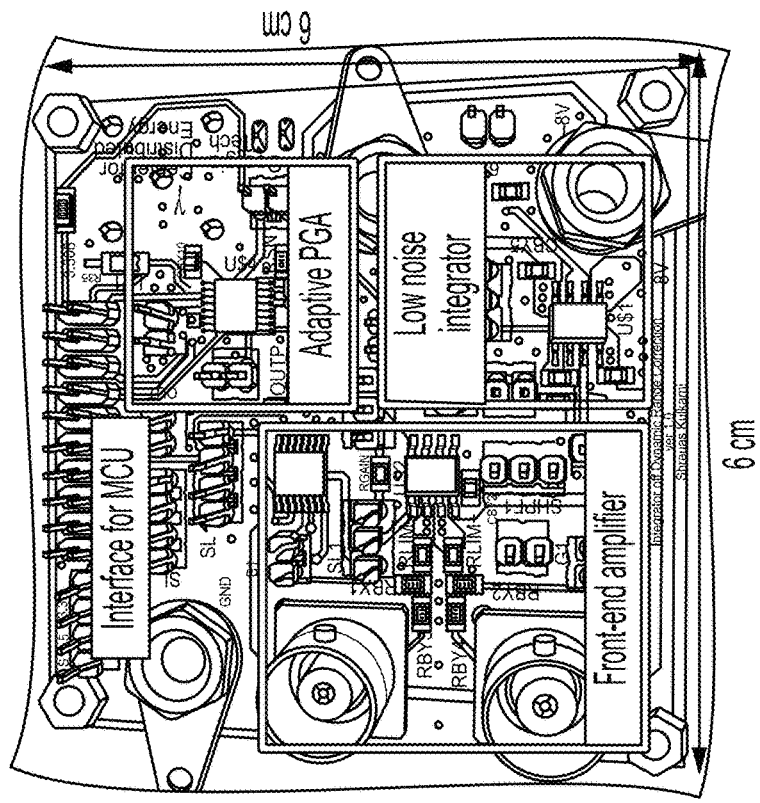
FIGS. 14A-C illustrate a test schematic, setup, and manufactured protype, of a current sensor, in accordance with exemplary embodiments of the present disclosure.
Figure 14A:
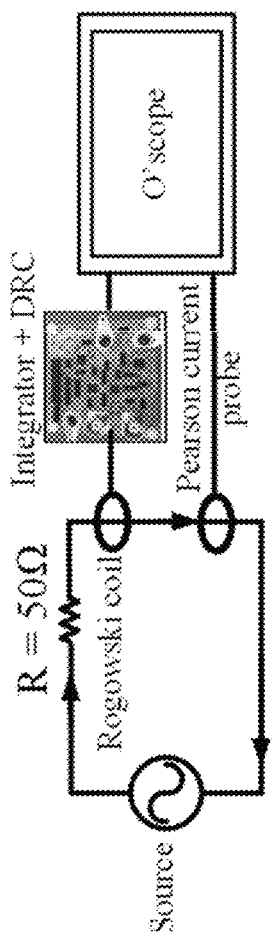
Figure 14B:
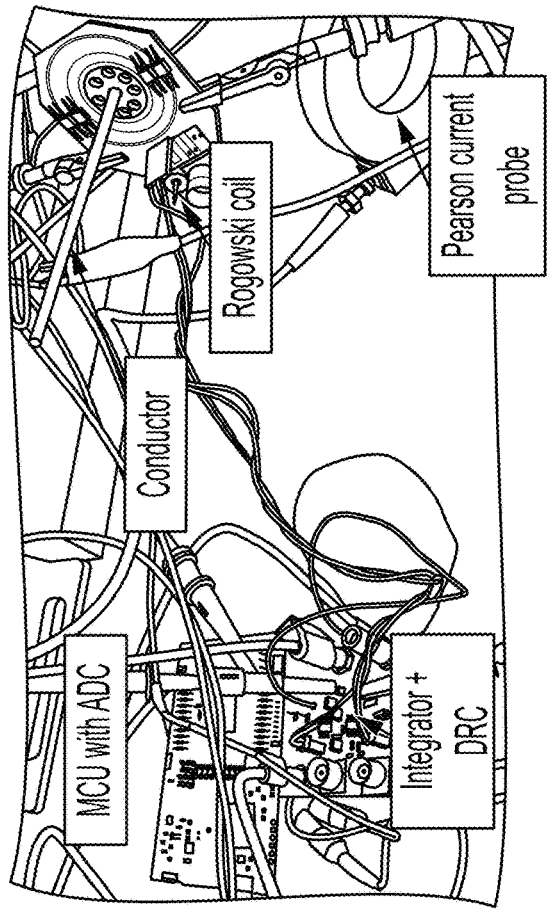
Figure 15A:
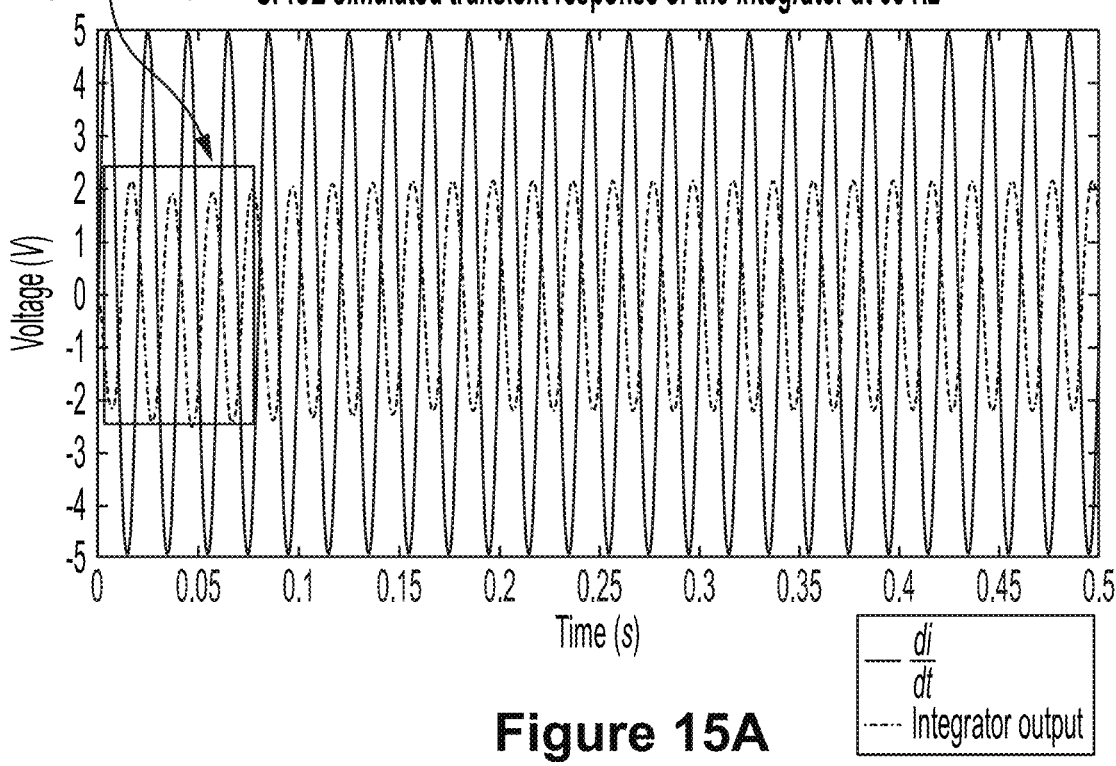
FIGS. 15A-D illustrate the transient response of an integrator: (A) SPICE simulations at 60 Hz; (B) hardware tests at 60 Hz provides; (C) SPICE simulations at 600 Hz; and (D) hardware tests at 600 Hz, in accordance with exemplary embodiments of the present disclosure.
Figure 15C:
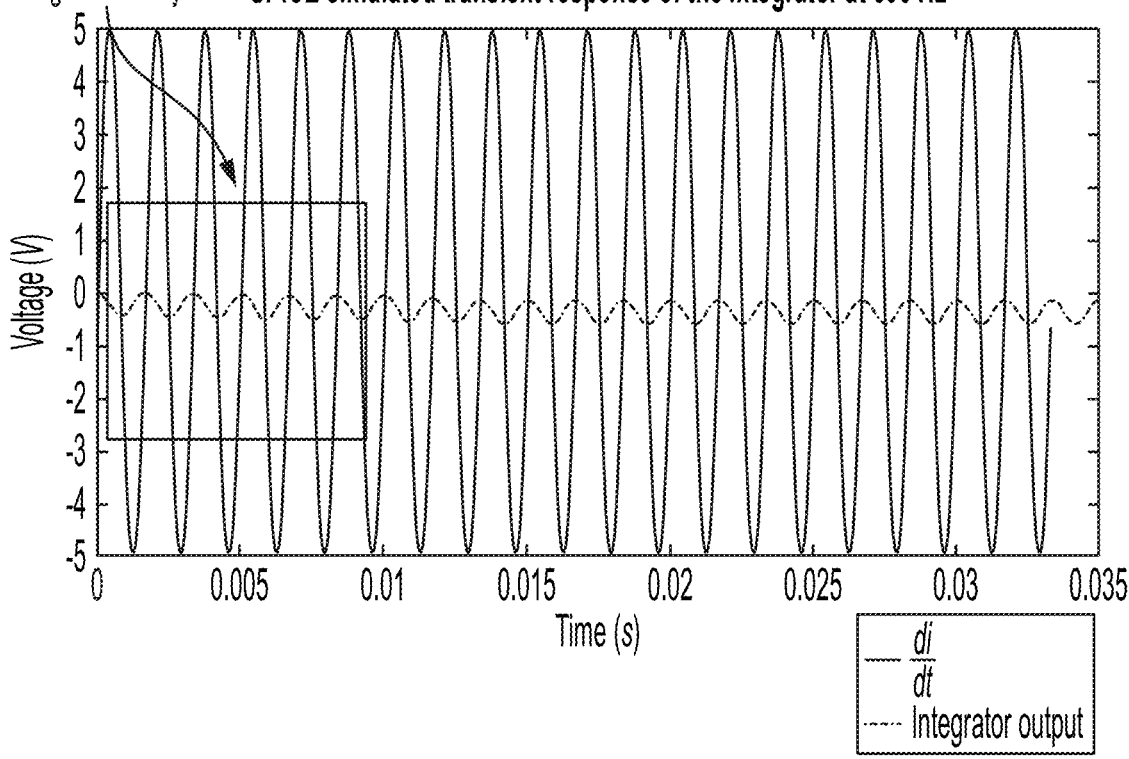
Figure 15B:
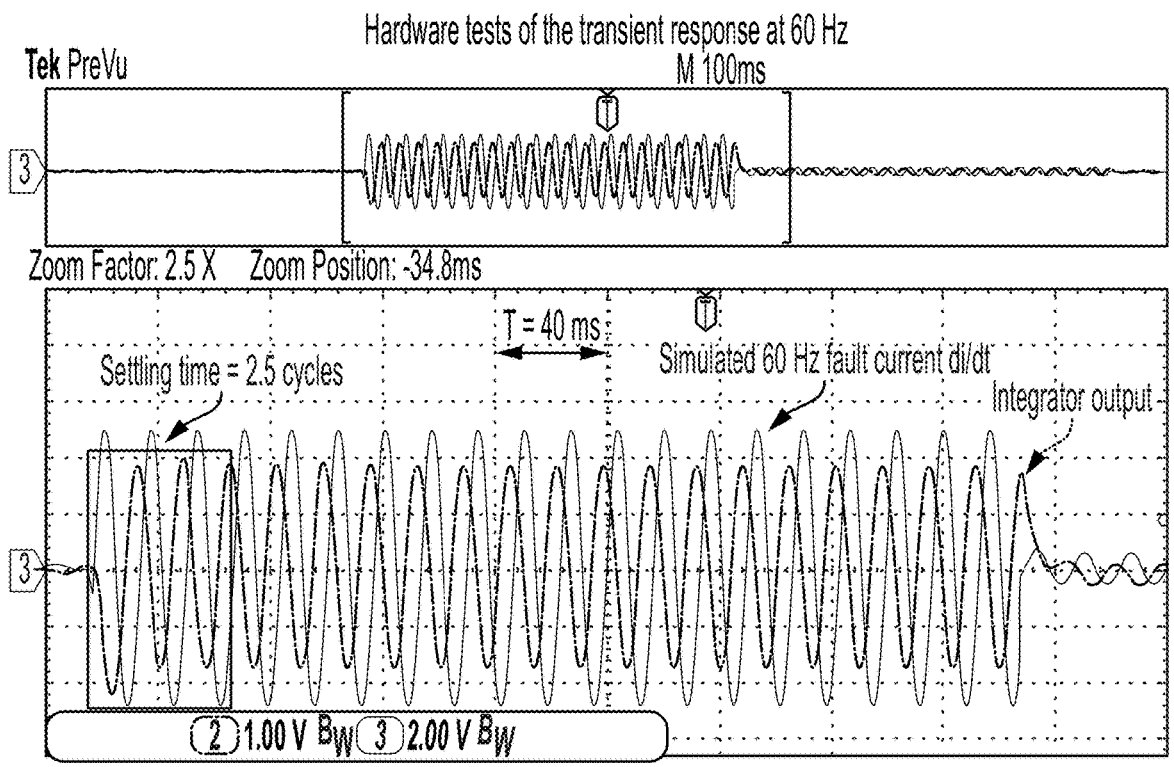
Figure 15D:
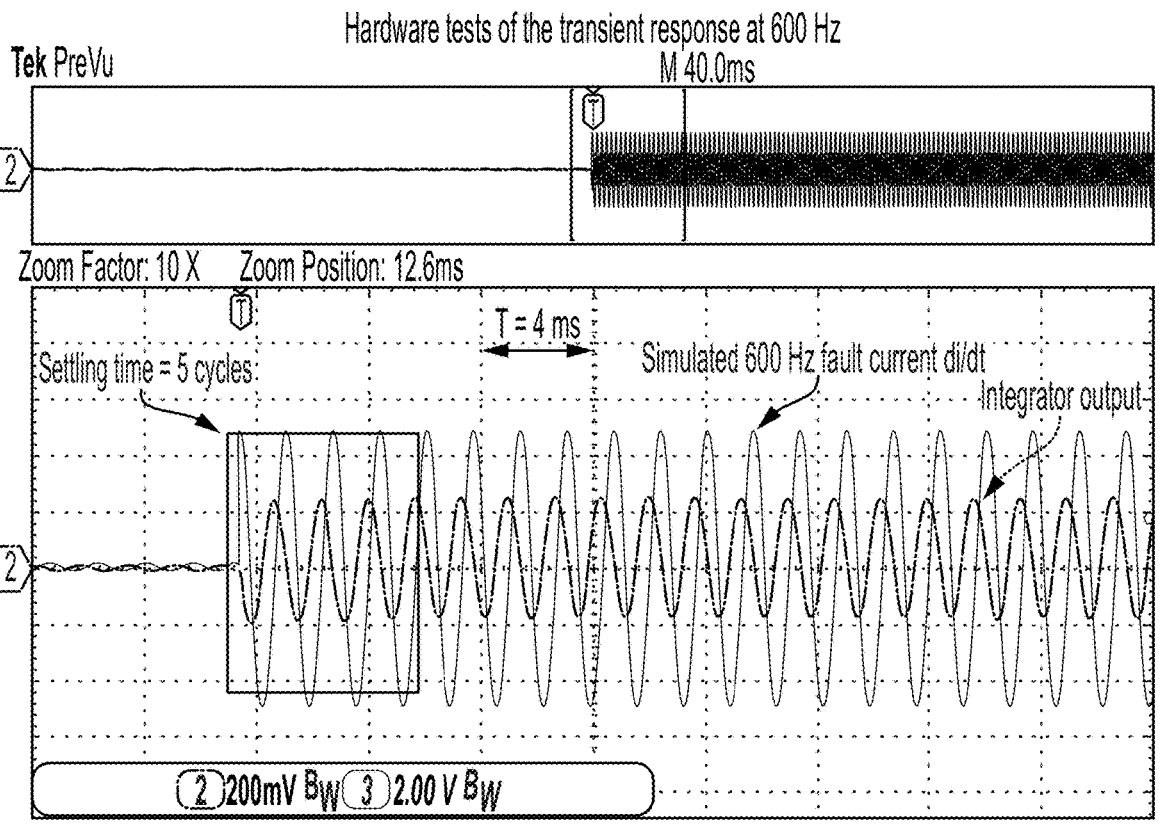

Performance of an exemplary current sensor will not be described. The exemplary current sensor was manufactured on a compact 6 cm by 6 cm PCB and the bench test setup is shown in FIGS. 14A-C. FIG. 14A illustrates a schematic of the tested exemplary sensor, FIG. 14B illustrates the test setup, and FIG. 14C illustrates the manufactured prototype. A Pearson current probe was used as a reference measurement to validate the performance of the proposed sensor.

Transient Response of the Integrator: For fault current capture, the integrator stage can be tuned for fast transient response, ideally settling to the expected values within a few line cycles, and not having a large overshoot. FIGS. 15A-D shows the simulated and experimental transient responses of the integrator stage to di/dt signals at 60 Hz and 600 Hz, respectively. It can be seen that the integrator transient settles within 2-5 cycles over a bandwidth accommodating 10 harmonics, without significant phase error.

Figure 16A:
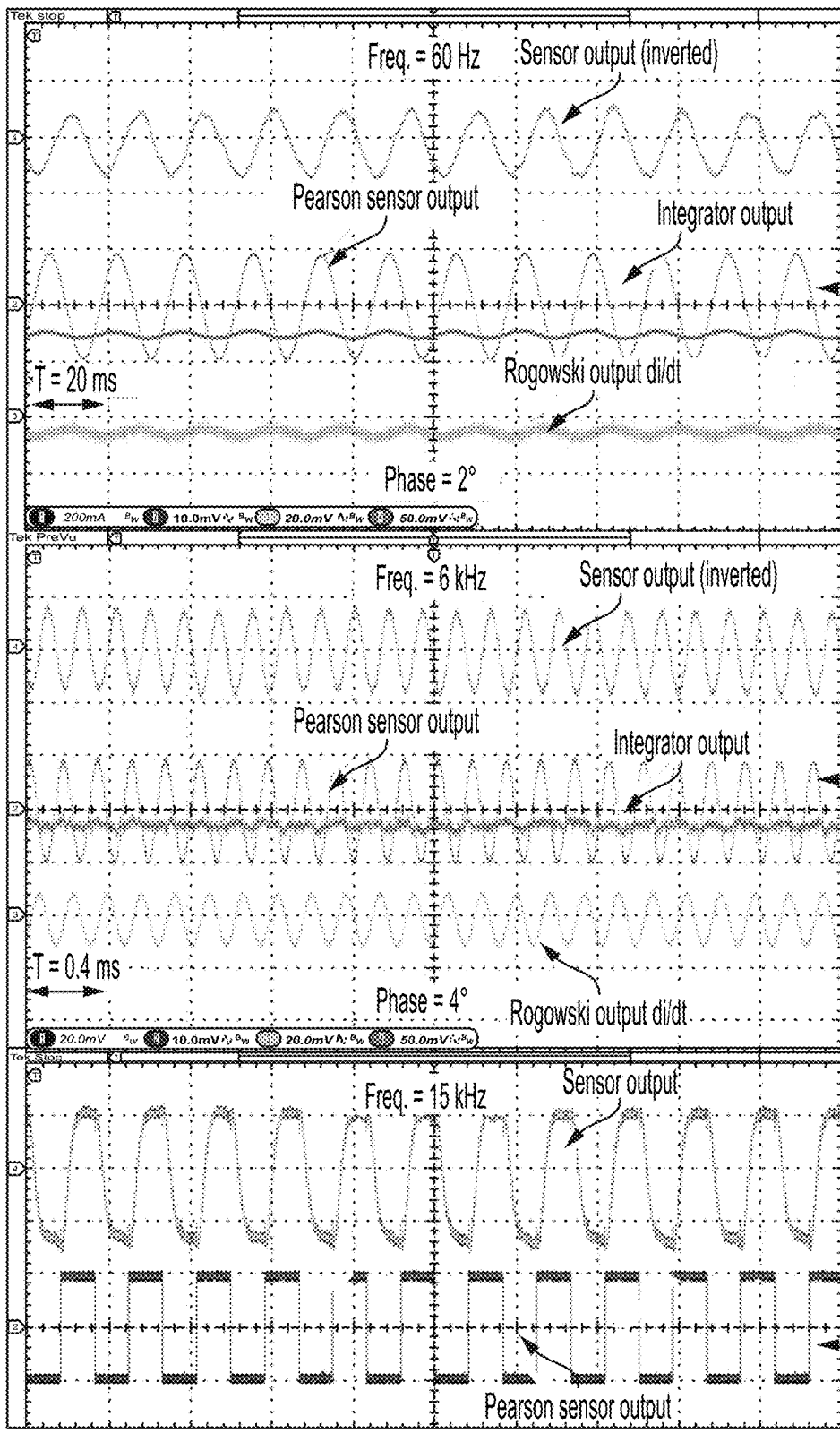
FIGS. 16A-B illustrate current sensor output at various frequencies: 60 Hz, 600 Hz, 6 kHz, 60 kHz sinusoidal excitation and at 15 kHz square and triangular wave excitation, in accordance with exemplary embodiments of the present disclosure.
Figure 16B:
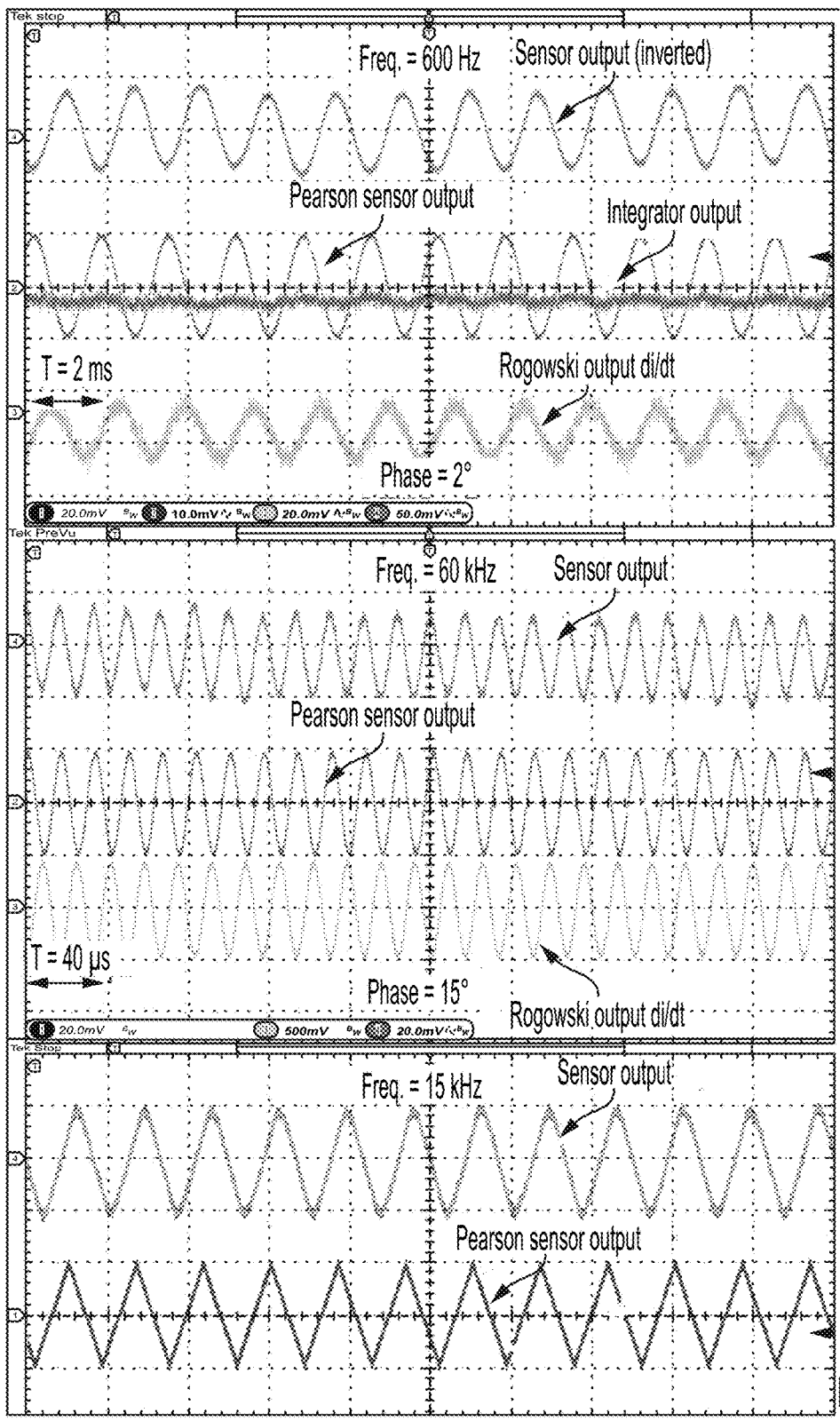
Figure 17:
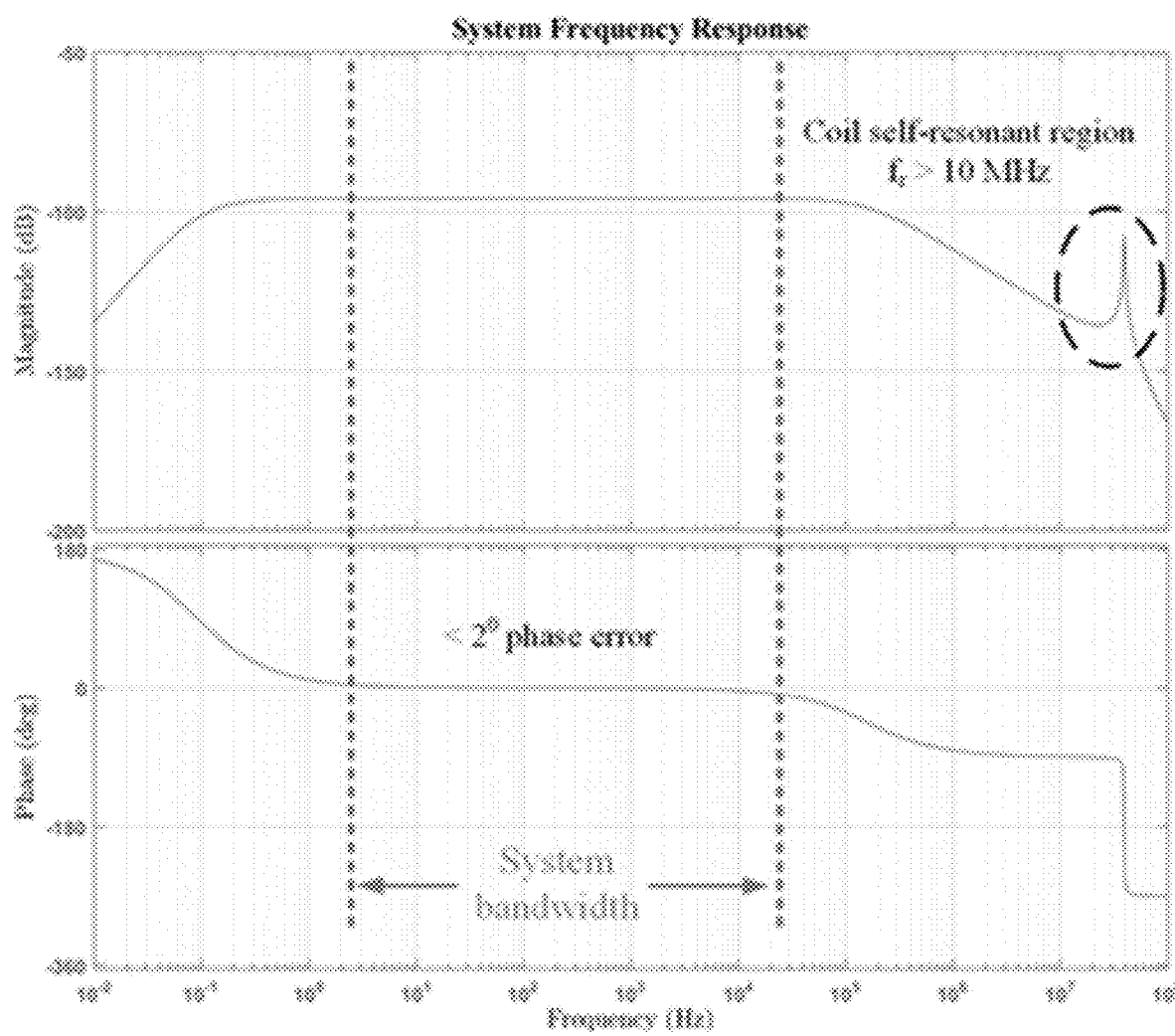
FIG. 17 provides a plot of the frequency response of an exemplary sensor from $i_p(t)$ to sensor output $v(t)$, in accordance with exemplary embodiments of the present disclosure.

Frequency Response: The response of the exemplary sensor at various frequencies is shown in FIGS. 16A-B. As seen, the sensor output tracks the current waveform as expected, with a phase error <2° at 60 Hz. Measured bandwidth was observed to be between 20 Hz and 15 kHz, accommodating good harmonic content for analyzing faults in power conductors. FIG. 17 illustrates the frequency response of the exemplary sensor from $i_p(t)$ to sensor output v(t), in which the magnitude of the response can be adjusted a dynamic range correction process as discussed below.

Figure 18A:
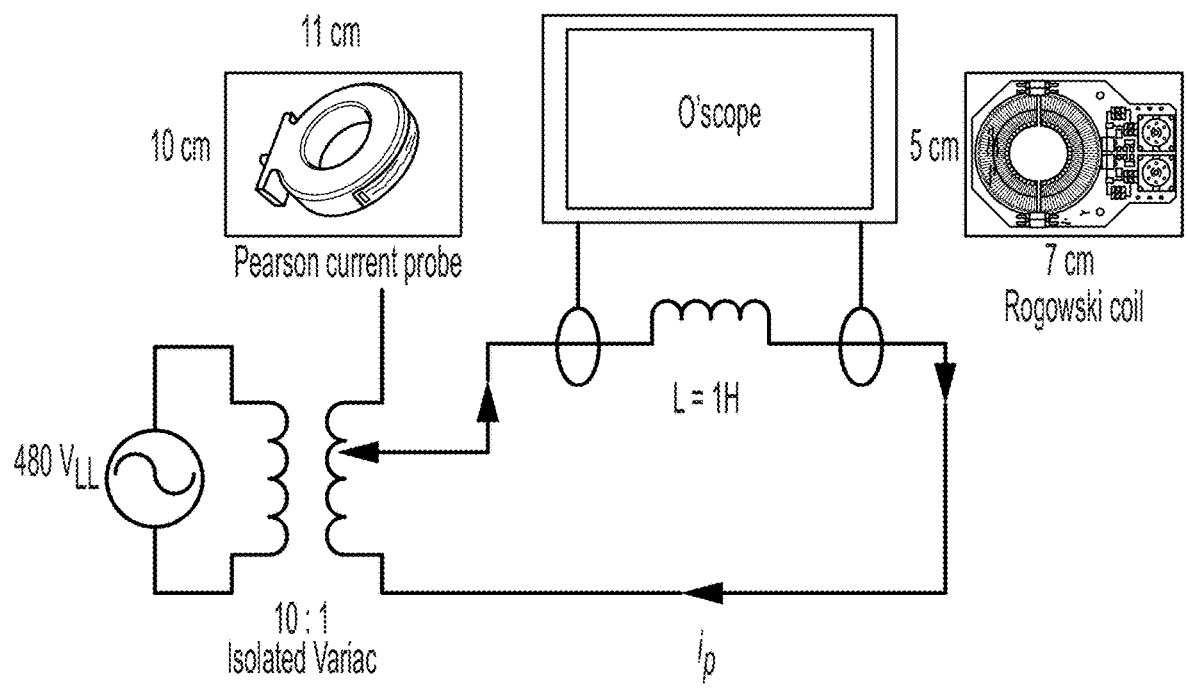
FIGS. 18A-B provide a schematic and test setup for a current circulating loop, in accordance with exemplary embodiments of the present disclosure.
Figure 18B:
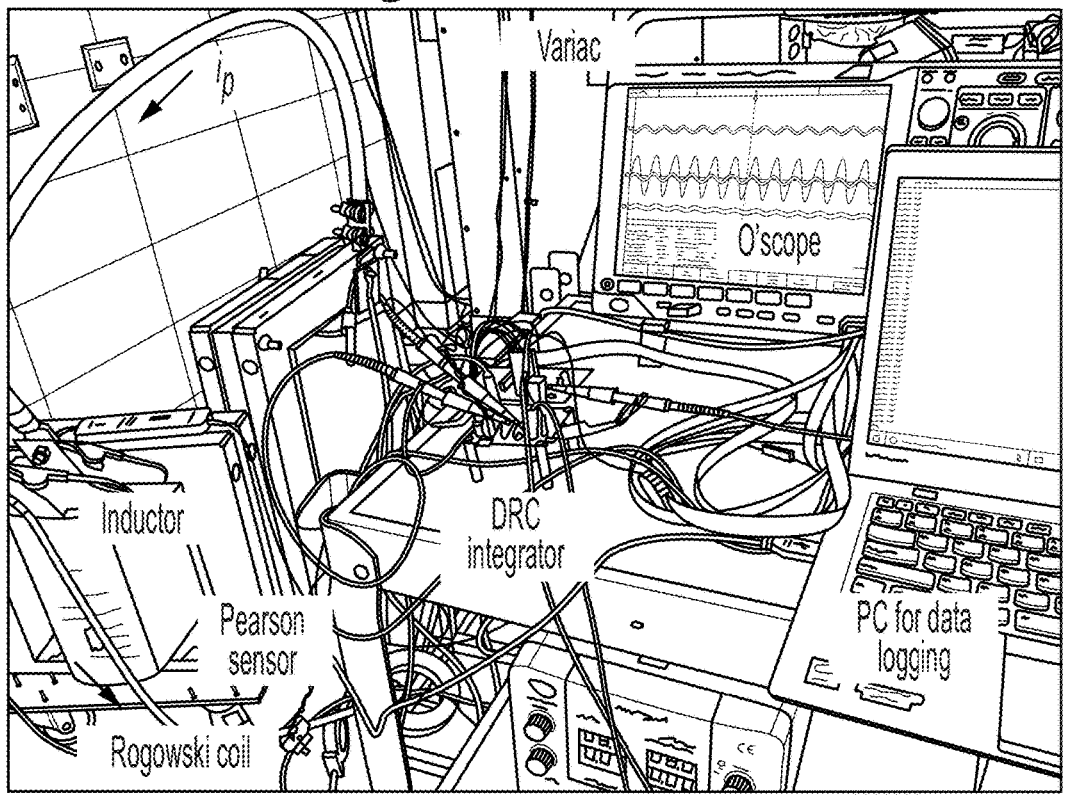
Figure 19:
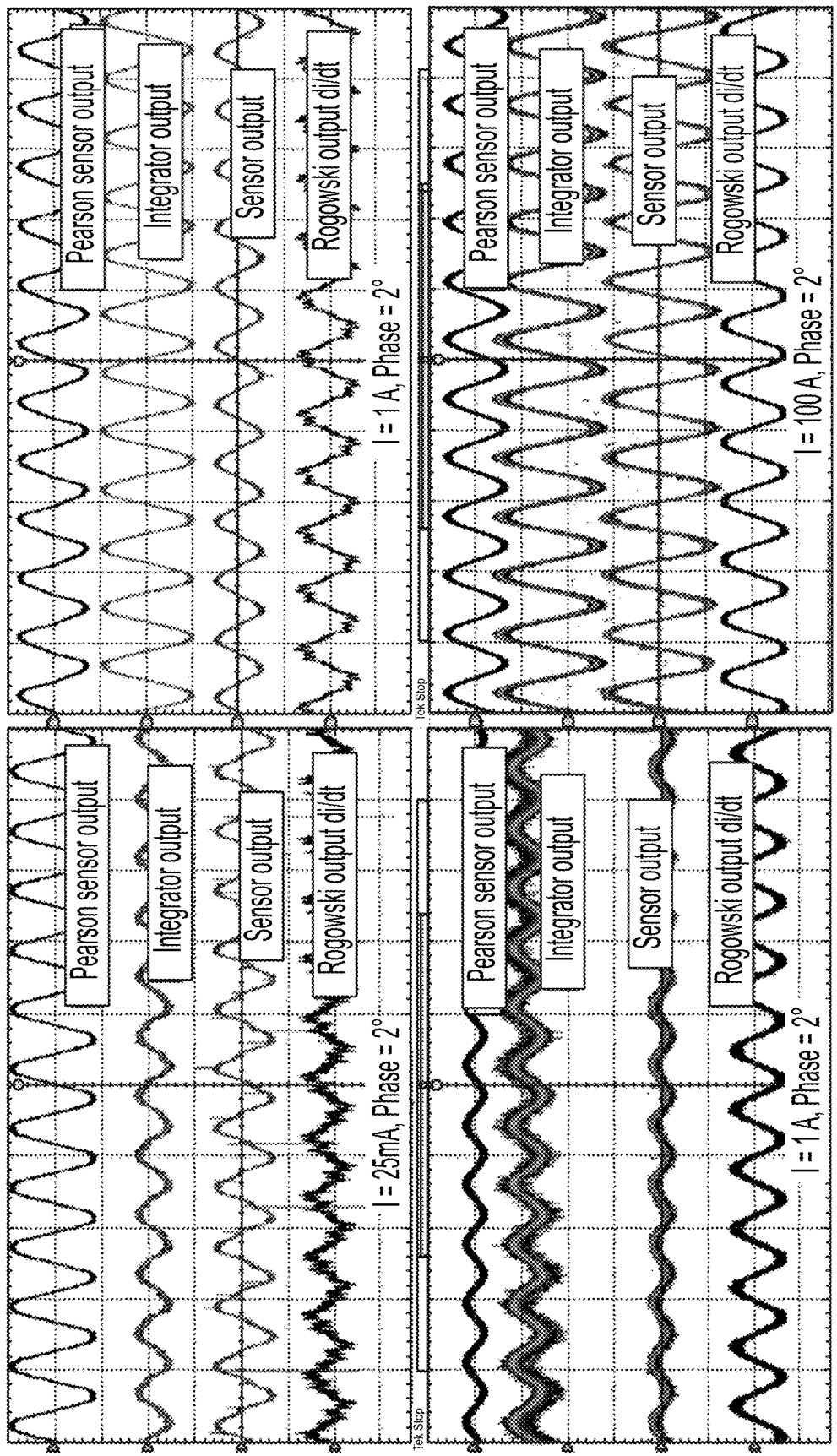
FIG. 19 provides plots of an exemplary current sensor's outputs at various input current levels at 60 Hz, in accordance with exemplary embodiments of the present disclosure.
Figure 20:
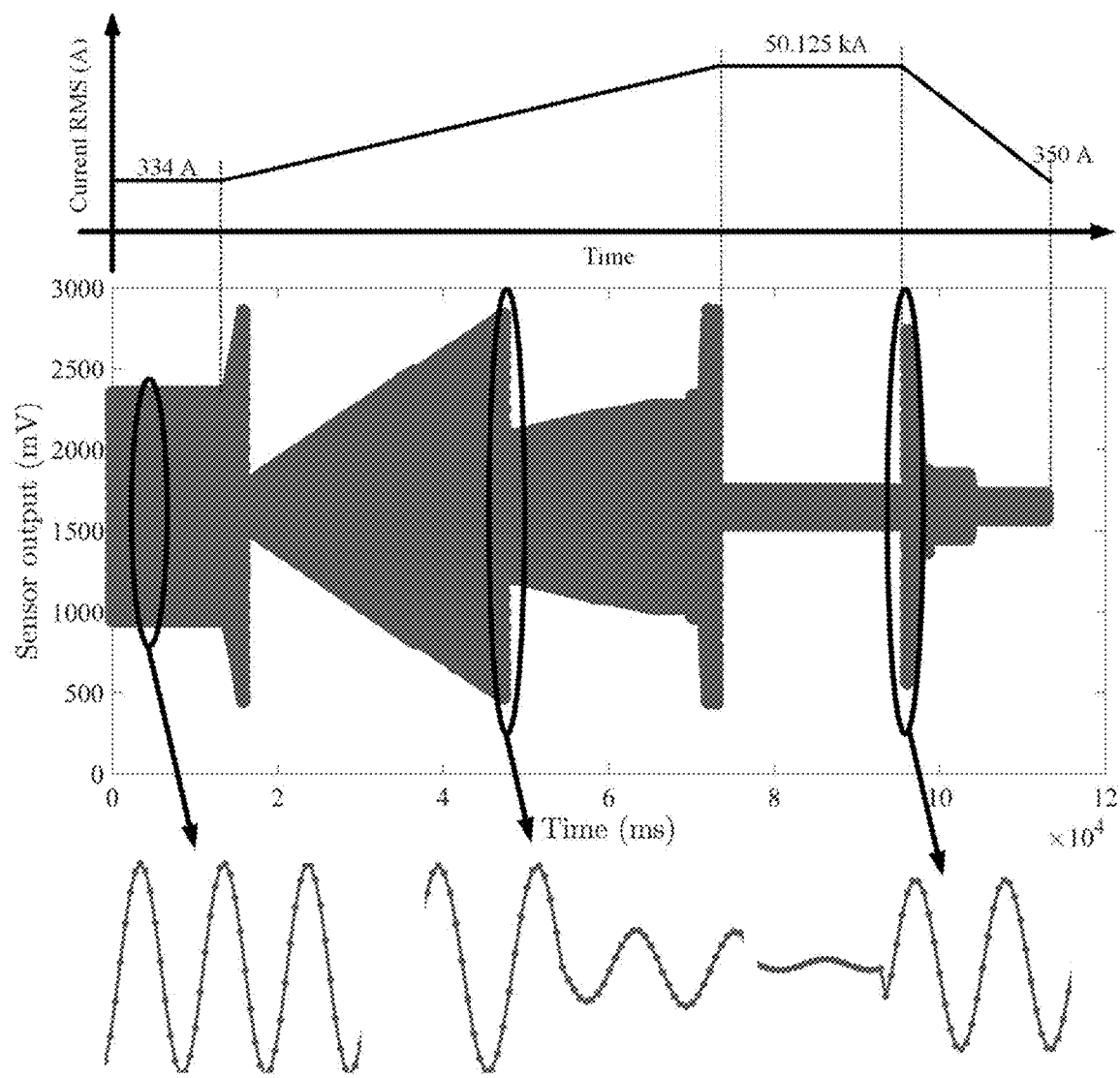
FIG. 20 provides plots of test waveforms for a dynamic range correction algorithm, in accordance with exemplary embodiments of the present disclosure.

Dynamic Range Correction: For higher currents, a current circulating loop was created as shown in FIG. 18. The sensor output at various current levels is shown in FIG. 19, with the output continually being within ADC full scale range. Test results from the dynamic range correction process are shown in FIG. 20, where di/dt signals corresponding to different fault current levels were applied and varied with time. The sensor adapted the gains to keep the analog output within the full scale of the ADC, without any distortion. The sensor output was effectively compressed from t=15-75 s and uncompressed from t=75-115 s as seen from the discrete ADC output. Effectively, the sensor was capable of measuring currents from 25 mA up to 50 kA without saturation or distortion. Thus, a dynamic range of 1:2,000,000 was achieved by the exemplary sensor.

Fault Current Capture and Waveform Reconstruction: In order to demonstrate the exemplary dynamic range correction algorithm along with waveform reconstruction using edge intelligence, a transient test was carried out using only di/dt signals corresponding to different fault currents. A di/dt signal corresponding to 410$A_{RMS}$ steady state was applied and then switched to the di/dt level corresponding to 21 kA$_{RMS}$ fault current state as shown in FIG. 21. The sensor intelligently adjusted the gain to maintain signal integrity and prevent distortion as seen from the ADC sampled signal in FIG. 21B. The waveform was reconstructed by the sensor and streamed to a computer for visualization as shown in FIG. 21C. Similar test showing recovery from a 50 kA$_{RMS}$ fault current to the 330 A$_{RMS}$ steady state is shown in FIG. 22.

Figure 23:
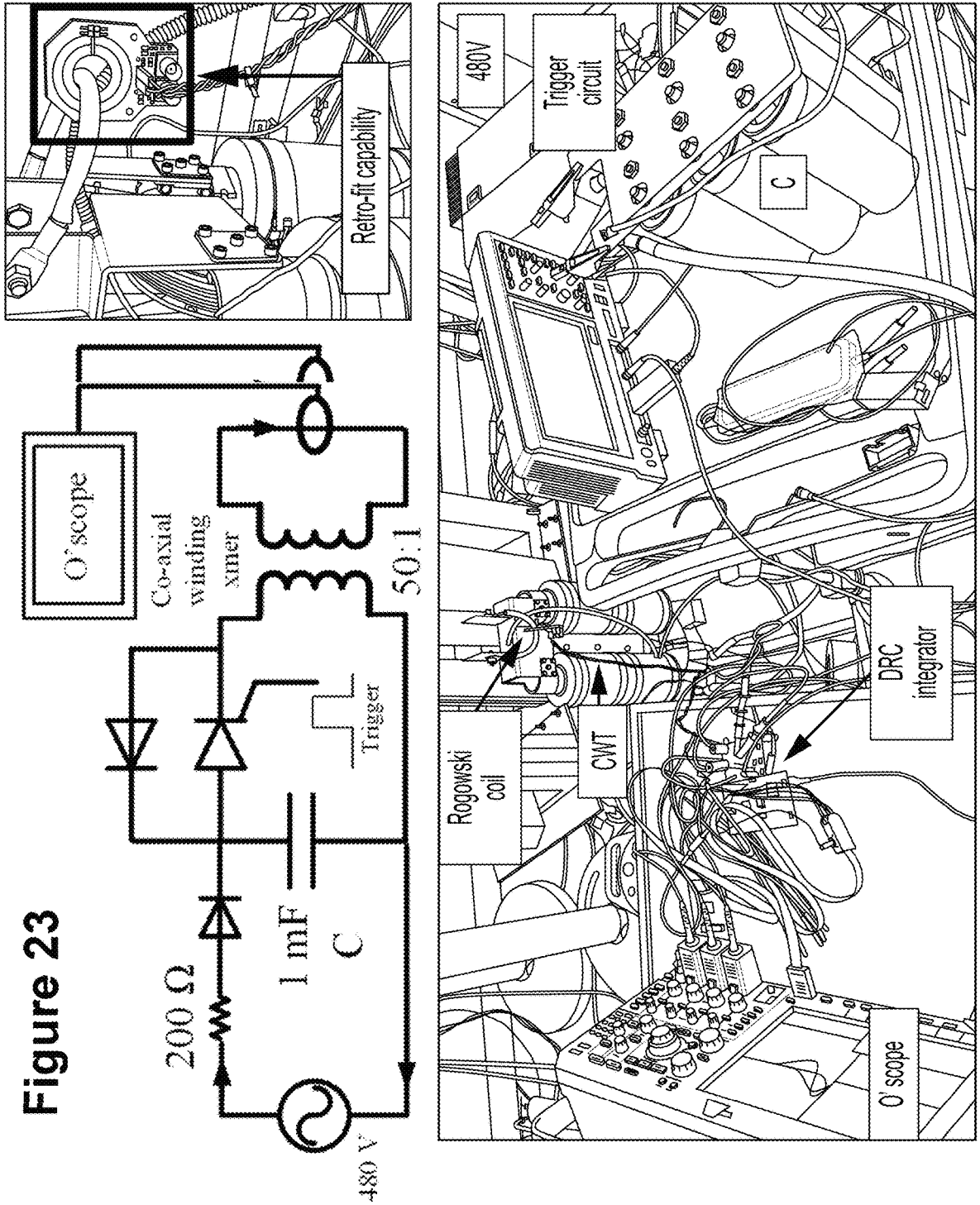
FIG. 23 provides a schematic and test set up to generate high current impulse using a co-axial winding transformer (CWT).
Figure 24A:
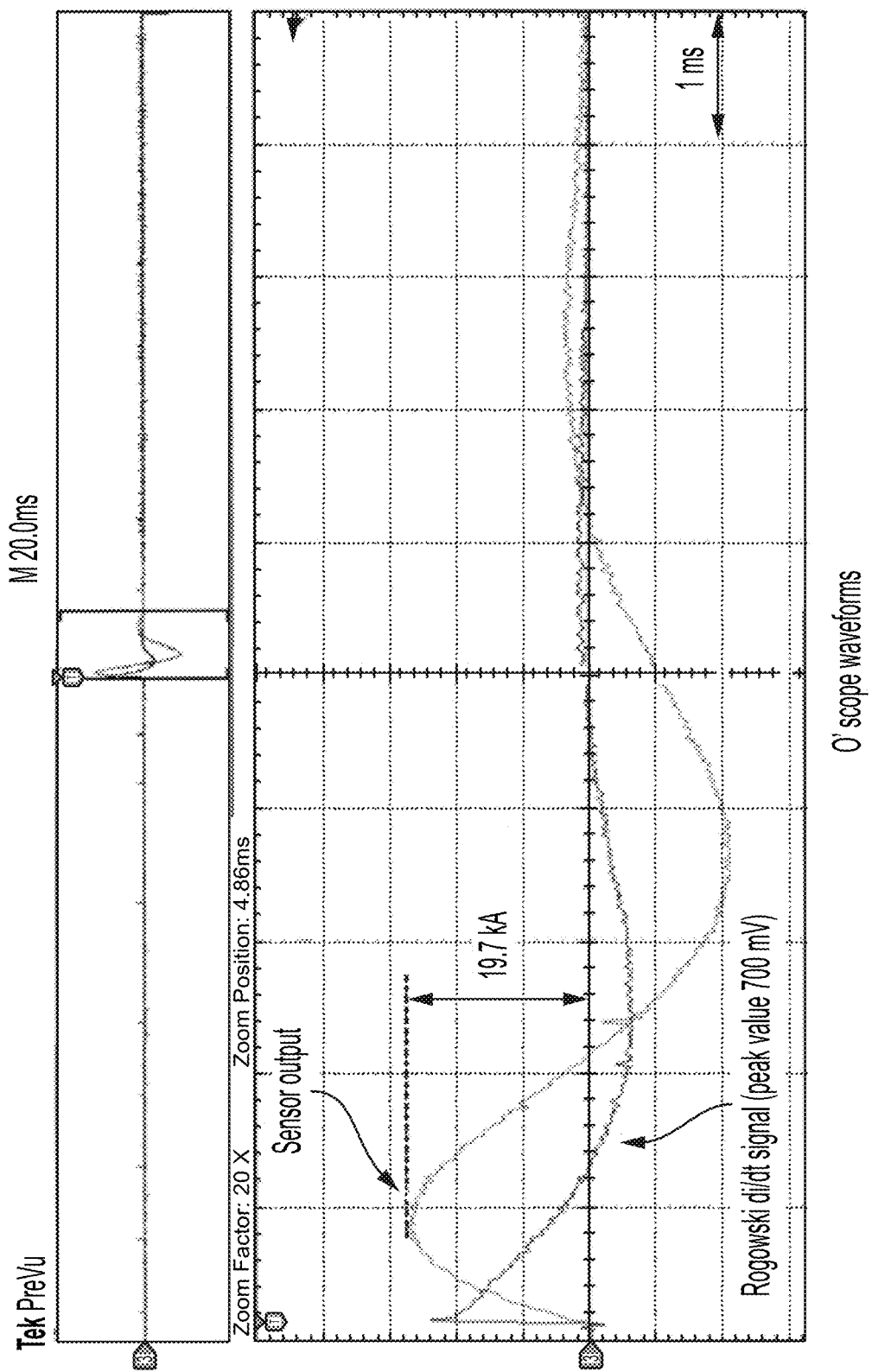

Next, to show that the Rogowski coil and the dynamic range correction integrator did not saturate at a high current level, an impulse test was carried out using the setup shown in FIG. 23. A capacitor bank (1 mF) was discharged into the primary winding of a 50:1 turns-ratio co-axial winding transformer (CWT). The secondary terminal was shorted to generate a high impulse current across the single turn and the proposed sensor clipped onto this terminal as shown in FIG. 23. The resulting di/dt signal generated by the clip-on Rogowski coil, and the integrated sensor output are shown in FIG. 24. The sensor output did not saturate.

The 2° phase error depends on the integrator parameters and was constant across the different gain stages. The gain stages switch within 400 ns, which is sufficiently fast for accurately capturing 60 Hz fault currents, while the transient response ensures fast settling. Thus, the same overall accuracy and phase error is maintained across the full dynamic range.

Auto-Triggering Circuit for Gain Adjustment: One approach for dynamically adjusting the individual gains of the analog front-end is to use the incoming di/dt signal itself. Level-triggered circuits can be used to switch gains when the incoming di/dt signals (the output of the Rogowski coil) vary beyond certain values. However, a look at the noise-spectra at individual stages reveals that this may not always be feasible. The signal-to-noise ratio (SNR) at the output of the exemplary Rogowski coil sensor was 20 dB at 60 Hz, i.e. the Mdi/dt signal was 20 dB above the noise floor when $i_p=2.67 A_{RMS}$. The signal was not strong enough to guarantee auto-triggering if it were to be used to drive a gain switching stage before the integration stage. Since the exemplary coil itself has a +20 dB/dec gain response, it can be seen that the SNR improves at higher frequencies.

Figure 25:
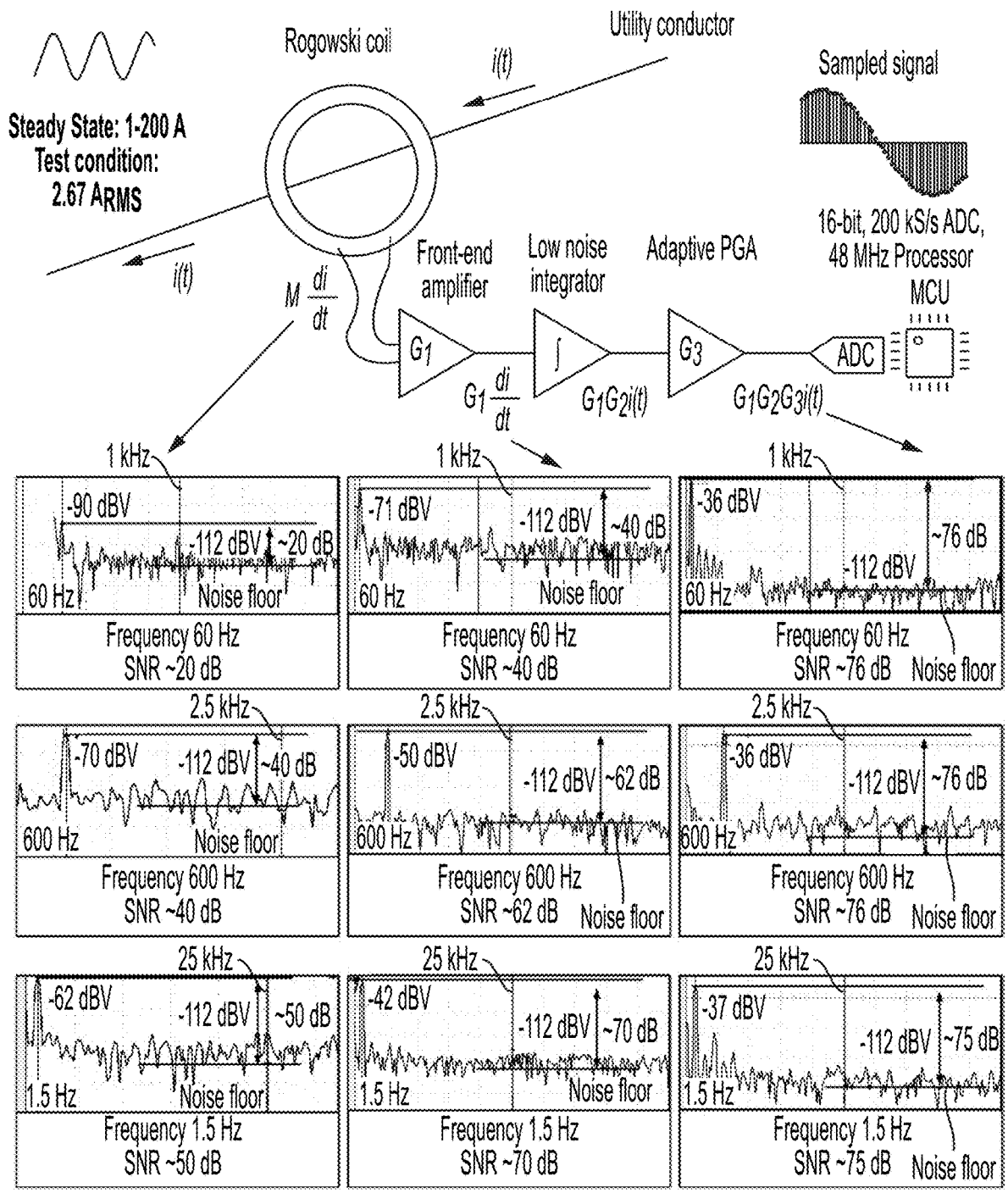
FIG. 25 illustrates noise spectra at various stages of an exemplary current sensor, in accordance with exemplary embodiments of the present disclosure.

As seen in FIG. 25, the combined analog stages can ensure a flat gain response across the bandwidth of interest and the overall system was able to achieve the same SNR of approximately 75 dB at the input of the ADC, across all frequencies. In the signal chain, the SNR at 60 Hz was seen to improve from 20 dB to 76 dB.

Drift Errors: The exemplary current sensor was operated continuously over 48 hours in order to quantify the drift errors in the system. Over this extended run, the system output had a drift of 0.1 mV in the output and a 0.1° drift in phase. This was resolved by periodically resetting the integrator so that the errors do not accumulate significantly. In the exemplary system, the MCU can shut down the front-end amplifier and the adaptive PGA, thereby driving the integrator output to zero and resetting it.

Figure 26:
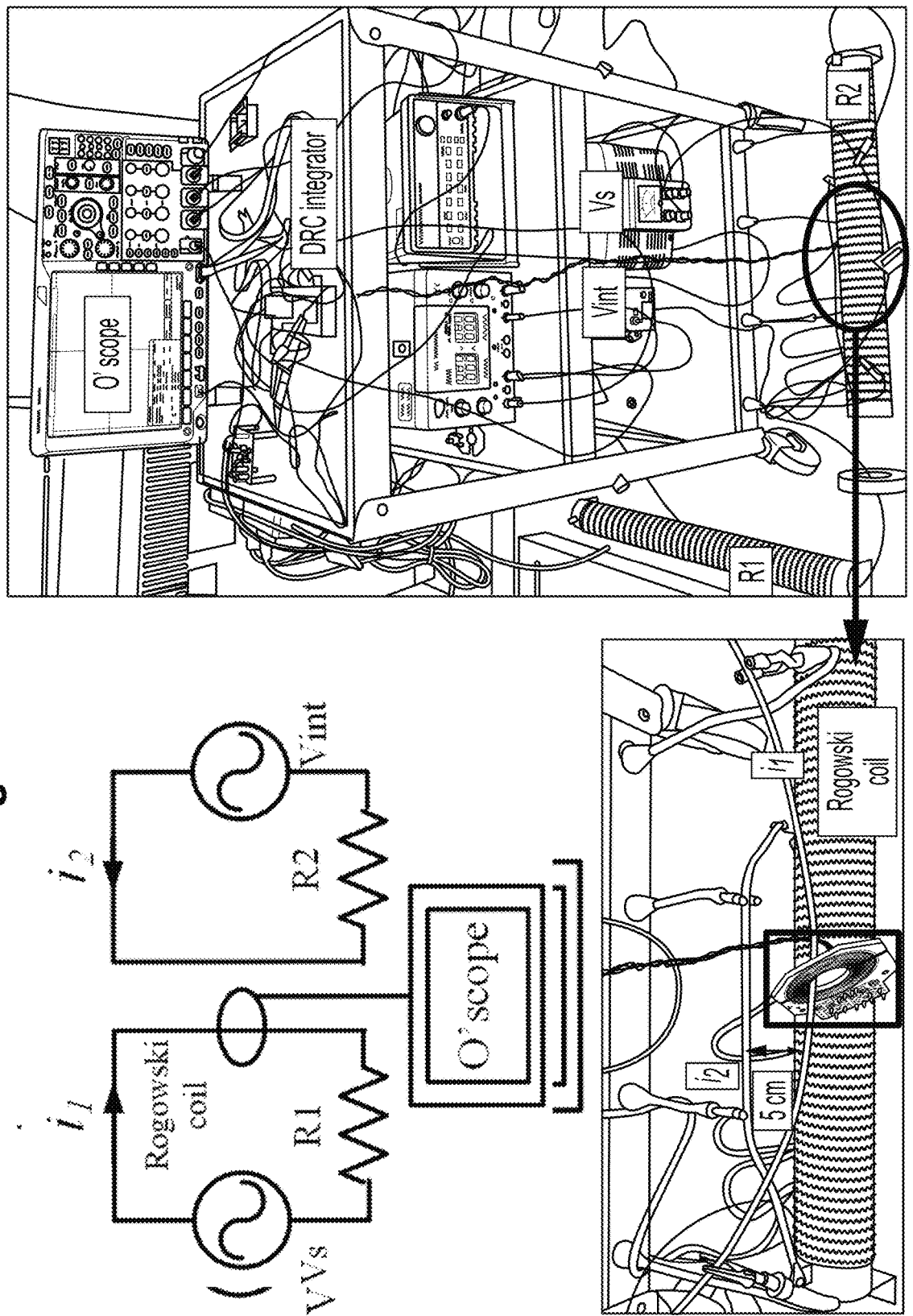
FIG. 26 provides a schematic and test setup for performing an interference test, in which $i_1$ is the current being measured and $i_2$ is the external noise sourced, placed at a distance of 6 cm from the Rogowski coil, in accordance with exemplary embodiments of the present disclosure.

Immunity to External Interference: Since Rogowski coil sensors encircle the conductor, they are relatively immune to the stray magnetic fields produced by conductors around them. This can be seen by the definition of mutual inductance due to external current-carrying conductor, $M_{ex}$ shown in Equation 10:

$$M_{ex} = \frac{d\phi_{ex}}{di_{ex}} = \frac{d\left(\sum_{j=1}^{N} \int_c A_{ex}^j \cdot dl\right)}{di_{ex}} \quad \text{Equation 10}$$

where N is the number of turns in the coil, and $A_{ex}^j$ is the vector potential field over the $j^{th}$ turn. It can be seen that since the encircled area becomes zero as N becomes large enough, $M_{ex}$ is approximately zero. To verify this, an experiment to quantify the external interference was conducted using the setup shown in FIG. 26. As seen from Table III, the effect of interference, in the worst case (i.e., when $i_2/i_1=10$) is less than 0.8%.

TABLE IV

RESULTS FROM INTERFERENCE TEST

| | Output ($mV_{RMS}$) | | | |
|---|---|---|---|---|
| $i_1$ | $i_2 = 0$ | $i_2 = 1 A$ | $i_2 = 5 A$ | $i_2 = 10 A$ |
| 1A | 131 | 131 | 131 | 130 |
| 5A | 742 | 742 | 742 | 742 |
| 10A | 175 | 175 | 175 | 175 |

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A current sensor comprising:
   a printed circuit board having an aperture configured to receive a conductor carrying an alternating electric current to be measured;
   a Rogowski coil positioned on the printed circuit board along a perimeter of the aperture; and
   a controller in electrical communication with the Rogowski coil and configured to generate an output signal indicative of the alternating electric current;
   wherein the current sensor is configured to;
   measure the alternating electric current relative to a full scale at a resolution of 1000:1 and at an accuracy within 1%; and
   receive a signal from the Rogowski coil and amplify the signal by a predetermined variable gain.

2. The current sensor of claim 1, wherein the controller is further configured to reduce the predetermined variable gain if both a magnitude of the signal from the Rogowski coil exceeds a first predetermined value and a rate of change of the magnitude of the signal from the Rogowski coil exceeds a second predetermined value.

3. The current sensor of claim 1, wherein the controller is further configured to increase the predetermined variable gain if both a magnitude of the signal from the Rogowski coil falls below a third predetermined value and a rate of change of the magnitude of the signal from the Rogowski coil falls below a fourth predetermined value.

4. The current sensor of claim 1, wherein the controller is further configured to generate the output signal indicative of the alternating electric current carried by the conductor at a sampling rate.

5. The current sensor of claim 4, wherein the controller is further configured to increase the sampling rate if both a magnitude of the signal from the Rogowski coil exceeds a first predetermined value and a rate of change of the magnitude of the signal from the Rogowski coil exceeds a second predetermined value.

6. The current sensor of claim 4, wherein the controller is further configured to decrease the sampling rate if both a magnitude of the signal from the Rogowski coil falls below a first predetermined value and a rate of change of the magnitude of the signal from the Rogowski coil falls below a second predetermined value.

7. The current sensor of claim 1, wherein the controller is further configured to generate the output signal indicative of the alternating electric current carried by the conductor in response to a command signal received from a remote device.

8. The current sensor of claim 1 further comprising:
a front-end amplifier;
a low noise integrator;
an adaptive programmable gain amplifier;
an analog-to-digital converter; and
a microcontroller.

9. The current sensor of claim 1, wherein the printed circuit board further comprises:
a first portion; and
a second portion;
wherein the first portion of the printed circuit board comprises a first portion of the aperture;
wherein the second portion of the printed circuit board comprises a second portion of the aperture; and
wherein the first portion of the printed circuit board is detachably connected to the second portion of the printed circuit board.

10. The current sensor of claim 1 further comprising a power supply configured to provide electrical power to the current sensor.

11. The current sensor of claim 10, wherein the power supply comprises a solar panel.

12. The current sensor of claim 1 further comprising a transceiver configured to transmit the output signal to a remote device.

13. The current sensor of claim 12, wherein the transceiver is a wireless transceiver.

14. A current sensor comprising:
a substrate having an aperture, the aperture configured to receive a conductor carrying an alternating current to be measured;
a Rogowski coil positioned along a perimeter of the aperture and configured to generate an analog signal proportional to a magnitude of the alternating current;
an analog circuit configured to receive the analog signal from the Rogowski coil and generate a gain-amplified analog output;
an analog-to-digital converter configured to receive the gain-amplified analog output and generate a digital signal; and
a microprocessor configured to:
decrease a variable gain applied to the analog signal if both the magnitude of the analog signal exceeds a first value and a rate of change of the magnitude of the analog signal exceeds a second value; and
increase the variable gain applied to the analog signal if both the magnitude of the analog signal falls below a third value and the rate of change of the magnitude of the analog signal falls below a fourth value.

15. The current sensor of claim 14,
wherein a first portion of the substrate comprises a first portion of the aperture;
wherein a second portion of the substrate comprises a second portion of the aperture;
wherein the first portion of the substrate is detachably connected to the second portion of the substrate;
wherein the analog circuit is further configured to apply the variable gain to the analog signal to generate the gain-amplified analog output; and
wherein the microprocessor is further configured to:
receive the digital signal; and
generate an output indicative of the magnitude of the current carried by the conductor.

16. The current sensor of claim 14 further comprising a power supply configured to provide electrical power to the current sensor.

17. The current sensor of claim 16, wherein the power supply comprises a solar panel.

18. The current sensor of claim 15 further comprising a transceiver configured to transmit the output indicative of the magnitude of the current carried by the conductor to a remote device.

19. The current sensor of claim 18, wherein the transceiver is a wireless transceiver.

20. The current sensor of claim 14, wherein the current sensor is configured to measure the alternating current relative to a full scale at a resolution of 1000:1 and at an accuracy within 1%; and
wherein the full scale can range over 5000:1.

21. A method comprising:
generating an analog signal at an output of a Rogowski coil, the analog signal proportional to a magnitude of an alternating current carried by a conductor in proximity of the Rogowski coil;
amplifying the analog signal by applying a variable gain to the analog signal to create a gain-amplified analog output;
converting the gain-amplified analog output to a gain-amplified digital output;
generating, based on the gain-amplified digital output, an output indicative of the magnitude of the alternating current;
decreasing the variable gain if both the magnitude of the analog signal exceeds a first value and a rate of change of the magnitude of the analog signal exceeds a second value; and
increasing the variable gain if both the magnitude of the analog signal falls below a third value and the rate of change of the magnitude of the analog signal falls below a fourth value.

22. The method of claim 21, wherein the Rogowski coil extends along a perimeter of an aperture in a substrate;
wherein the alternating current is carried by a conductor passing through the aperture; and
wherein the method further comprises transmitting the output indicative of the magnitude of the alternating current carried by the conductor to a remote device.

23. The method of claim 22, wherein the output indicative of the magnitude of the current carried by the conductor is transmitted via a wireless signal.

24. The method of claim 22 further comprising receiving a command from the remote device;
- wherein the transmitting is performed subsequent to the receiving the command.

25. The method of claim 21, wherein the Rogowski coil extends along a perimeter of an aperture in a substrate;
- wherein the Rogowski coil and the apertured substrate form a current sensor;
- wherein the alternating current is carried by a conductor passing through the aperture in the substrate;
- wherein the current sensor is configured to measure the alternating current carried by the conductor;
- wherein the current sensor is further configured to measure the alternating current relative to a full scale at a resolution of 1000:1 and at an accuracy within 1%; and
- wherein the full scale can range over 5000:1.

* * * * *